US012457741B2

(12) United States Patent
Rabkin et al.

(10) Patent No.: US 12,457,741 B2
(45) Date of Patent: Oct. 28, 2025

(54) MEMORY DEVICE INCLUDING COMPOSITE METAL OXIDE SEMICONDUCTOR CHANNELS AND METHODS FOR FORMING THE SAME

(71) Applicant: SANDISK TECHNOLOGIES LLC, Addison, TX (US)

(72) Inventors: Peter Rabkin, Cupertino, CA (US); Masaaki Higashitani, Cupertino, CA (US)

(73) Assignee: Sandisk Technologies, Inc., Milpitas, CA (US)

(*) Notice: Subject to any disclaimer, the term of this patent is extended or adjusted under 35 U.S.C. 154(b) by 586 days.

(21) Appl. No.: 17/661,783

(22) Filed: May 3, 2022

(65) Prior Publication Data

US 2023/0363158 A1 Nov. 9, 2023

(51) Int. Cl.

| | |
|---|---|
| ***H10B 43/27*** | (2023.01) |
| ***H01L 23/00*** | (2006.01) |
| ***H01L 25/00*** | (2006.01) |
| ***H01L 25/065*** | (2023.01) |
| ***H01L 25/18*** | (2023.01) |
| ***H10B 41/27*** | (2023.01) |

(52) U.S. Cl.

CPC ............. *H10B 43/27* (2023.02); *H01L 24/08* (2013.01); *H01L 24/80* (2013.01); *H01L 25/0657* (2013.01); *H01L 25/18* (2013.01); *H01L 25/50* (2013.01); *H10B 41/27* (2023.02); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search

None

See application file for complete search history.

(56) References Cited

U.S. PATENT DOCUMENTS

| | | | |
|---|---|---|---|
| 7,994,588 | B2 | 8/2011 | Yin et al. |
| 9,240,420 | B2 | 1/2016 | Rabkin et al. |
| 9,634,097 | B2 | 4/2017 | Rabkin et al. |
| 10,497,712 | B2 | 12/2019 | Tezuka et al. |
| 10,629,616 | B1 | 4/2020 | Kai et al. |
| 11,127,861 | B2 | 9/2021 | Sharma |
| 11,195,781 | B2 | 12/2021 | Okina et al. |
| 11,201,107 | B2 | 12/2021 | Okina et al. |
| 2009/0057745 | A1 | 3/2009 | Yin et al. |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Davienne N Monbleau

(74) *Attorney, Agent, or Firm* — THE MARBURY LAW GROUP PLLC

(57) ABSTRACT

A memory die includes an alternating stack of insulating layers and electrically conductive layers, a memory opening vertically extending through the alternating stack, and a memory opening fill structure located in the memory opening and including a memory film and a vertical composite metal oxide semiconductor channel having a different composition between its inner and outer portions.

10 Claims, 31 Drawing Sheets

(56) References Cited

U.S. PATENT DOCUMENTS

| | | | | |
|---|---|---|---|---|
| 2015/0069377 | A1 | 3/2015 | Rabkin et al. | |
| 2016/0064406 | A1 | 3/2016 | Natori et al. | |
| 2016/0099250 | A1 | 4/2016 | Rabkin et al. | |
| 2016/0148947 | A1* | 5/2016 | Seo | H10B 43/10 257/324 |
| 2016/0149004 | A1 | 5/2016 | Rabkin et al. | |
| 2018/0331116 | A1 | 11/2018 | Tezuka et al. | |
| 2021/0066458 | A1* | 3/2021 | Tak | H01L 29/247 |
| 2021/0066509 | A1 | 3/2021 | Sharma | |
| 2021/0202703 | A1 | 7/2021 | Rajashekhar et al. | |
| 2021/0202751 | A1* | 7/2021 | Goda | H10D 89/911 |
| 2021/0242241 | A1 | 8/2021 | Rajashekhar et al. | |

OTHER PUBLICATIONS

Rim, Y. S. et al., "Boost Up Mobility of Solution-Processed Metal Oxide Thin-Film Transistors via Confining Structure on Electron Pathways," Advanced Materials, vol. 26, No. 25, pp. 4273-4278, (2014), DOI:10.1002/adma.201400529.

Yamazaki, S. et al., "In-Ga-Zn-Oxide Semiconductor and Its Transistor Characteristics," *ECS J. Solid State Sci. Technol.*, vol. 3, No. 9, pp. Q3012-Q3022 (2014), https://iopscience.jop.org/article/10.1149/2.003409jss/meta.

U.S. Appl. No. 17/007,761, filed Aug. 28, 2020, SanDisk Technologies LLC.

U.S. Appl. No. 17/007,823, filed Aug. 31, 2020, SanDisk Technologies LLC.

U.S. Appl. No. 17/082,629, filed Oct. 28, 2020, SanDisk Technologies LLC.

U.S. Appl. No. 17/362,034, filed Jun. 29, 2021, SanDisk Technologies LLC.

UPSTO Office Communication, Non-Final Office Action for U.S. Appl. No. 18/045,070, mailed Apr. 2, 2025, 22 pages.

* cited by examiner

MEMORY DEVICE INCLUDING COMPOSITE METAL OXIDE SEMICONDUCTOR CHANNELS AND METHODS FOR FORMING THE SAME

FIELD

The present disclosure relates generally to the field of semiconductor devices, and particularly to a three-dimensional memory device including composite metal oxide semiconductor channels and methods for forming the same.

BACKGROUND

A three-dimensional memory device including a three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory die includes an alternating stack of insulating layers and electrically conductive layers, a memory opening vertically extending through the alternating stack, and a memory opening fill structure located in the memory opening and including a memory film and a vertical composite metal oxide semiconductor channel having a different composition between its inner and outer portions.

According to another aspect of the present disclosure, a method of forming a memory structure includes forming an alternating stack of insulating layers and spacer material layers over a substrate, wherein the spacer material layers are formed as or are subsequently replaced with electrically conductive layers, forming a memory opening through the alternating stack, and forming a memory opening fill structure in the memory opening, wherein the memory opening fill structure comprises a memory film and a vertical composite metal oxide semiconductor channel having a different composition between its inner and outer portions.

DETAILED DESCRIPTION

Figure 1:
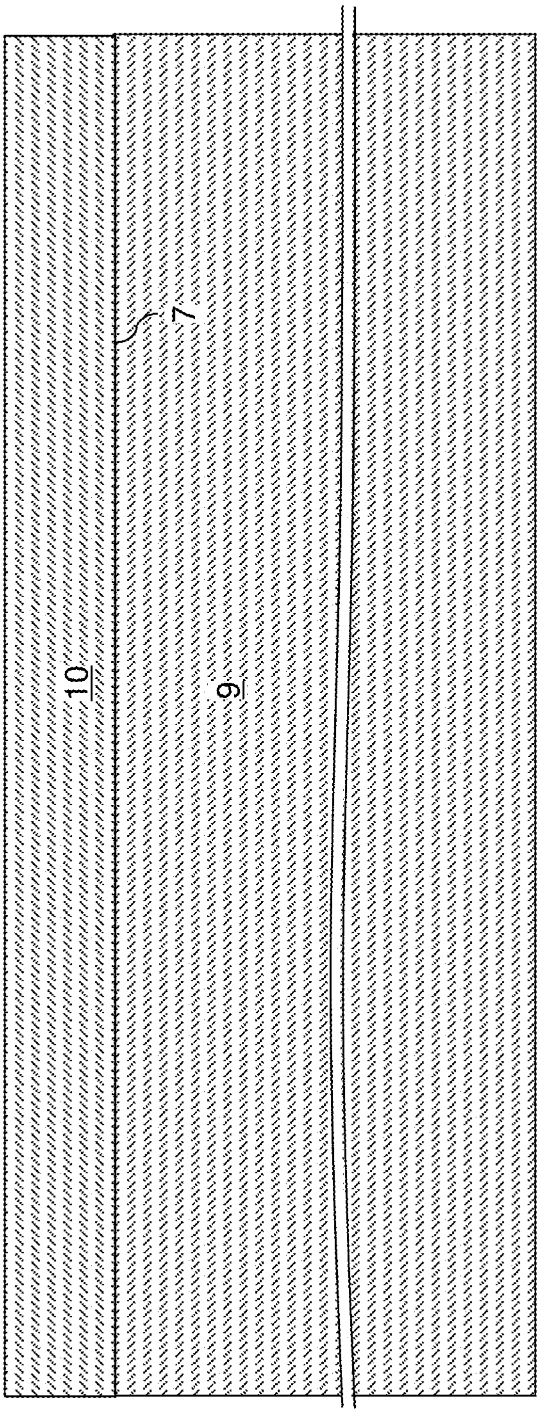
FIG. 1 is a schematic vertical cross-sectional view of an exemplary structure including a carrier substrate according to an embodiment of the present disclosure.

As discussed above, the embodiments of the present disclosure are directed to a three-dimensional memory device including composite metal oxide semiconductor channels and methods for forming the same, the various aspects of which are described below. The embodiments of the present disclosure can be used to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein. As used herein, a first electrical component is electrically connected to a second electrical component if there exists an electrically conductive path between the first electrical component and the second electrical component.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. Each plane contains a number of memory blocks (or "blocks"), which are the smallest unit that can be erased by in a single erase operation. Each memory block contains a number of pages, which are the smallest units that can be selected for programming.

Metal oxide semiconductor materials, such as indium gallium zinc oxide (IGZO), exhibit a number of issues affecting device performance and reliability, such as insufficient on-current and bias instability (e.g., Vt shift), etc. Generally, it is desirable to achieve higher mobility, higher on current and lower leakage current in the metal oxide semiconductor channel. The embodiments of the present disclosure provide composite metal oxide semiconductor channels for use in a three-dimensional memory device, such as a three-dimensional NAND device. Embodiments of the present disclosure may be employed to provide higher charge carrier mobility, a lower subthreshold slope, a higher cell current and on current, and lower leakage current compared to prior art single layer metal oxide semiconductor channels.

Referring to FIG. 1, an exemplary structure according to an embodiment of the present disclosure is illustrated, which can be used, for example, to fabricate a device structure containing vertical NAND memory devices. The exemplary structure includes a carrier substrate 9 and a semiconductor material layer 10 located on a top surface of the carrier substrate 9. The carrier substrate 9 can include a substrate material layer, which may include a semiconductor material (such as silicon), a dielectric material (such as silicon oxide), or a conductive material (such as a metal). In one embodiment, the carrier substrate 9 and the semiconductor material layer 10 may be provided as a commercially available single crystalline silicon wafer. A surface portion of the single crystalline semiconductor wafer can include a doped semiconductor well which comprises the semiconductor material layer 10. An interface 7 is located between the carrier substrate 9 and the semiconductor material layer 10.

Alternatively, the semiconductor material layer 10 can include a single crystalline or polycrystalline semiconductor (e.g., silicon) material layer provided on the carrier substrate 9. In this case, the carrier substrate 9 can include an insulating material (such as sapphire or silicon oxide), a conductive material, or a semiconductor material which is the same as or different from the material of the semiconductor material layer 10. Thus, the semiconductor material layer 10 includes at least one elemental semiconductor material (e.g., single crystal silicon or polysilicon layer or well), at least one III-V compound semiconductor material, at least one II-VI compound semiconductor material, at least one organic semiconductor material, or other semiconductor materials known in the art.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Figure 2:
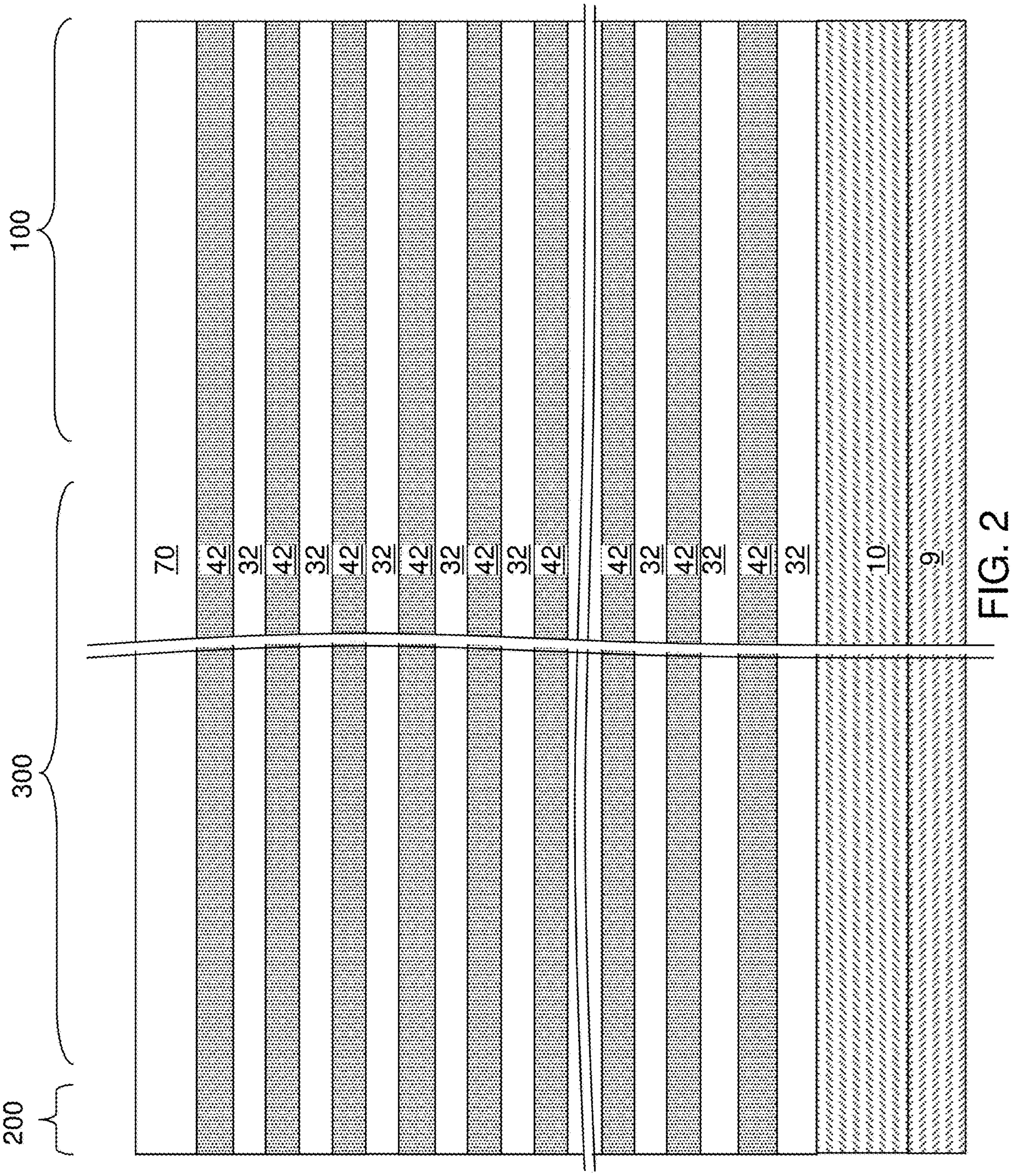
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the semiconductor material layer 10. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the three-dimensional NAND string memory devices to be subsequently formed.

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While an embodiment is described above in which the spacer material layers are sacrificial material layers 42 that are subsequently replaced with electrically conductive layers, in other embodiments, the sacrificial material layers are formed as electrically conductive layers. In such embodiments, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be used for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

The exemplary structure can include at least one memory array region 100 in which a three-dimensional array of memory elements is to be subsequently formed, at least one staircase region 300 in which stepped surfaces of the alternating stack (32, 42) are to be subsequently formed, and an interconnection region 200 in which interconnection via structures extending through the levels of the alternating stack (32, 42) are to be subsequently formed.

In one alternative embodiment, a peripheral device region containing the at least one semiconductor device for a peripheral circuitry may be located in the memory array region 100 under the alternating stack (32, 42) in a CMOS under array configuration.

Figure 3:
FIG. 3 is a schematic vertical cross-sectional view of the exemplary structure after formation of stepped surfaces and a stepped dielectric material portion according to an embodiment of the present disclosure.

Referring to FIG. 3, stepped surfaces are formed in the staircase region 300, which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the interconnection region 200 containing the at least one semiconductor device for the peripheral circuitry. The stepped cavity can have various stepped surfaces such that the horizontal cross-sectional shape of the stepped cavity changes in steps as a function of the vertical distance from the top surface of the semiconductor material layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset one from another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom).

Configurations using three, four, or more columns of staircases with a respective set of vertical offsets among the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases monotonically as a function of a vertical distance from a top surface of a substrate on which the element is present. If silicon oxide is used for the stepped dielectric material portion 65, the silicon oxide of the stepped dielectric material portion 65 may, or may not, be doped with dopants such as B, P, and/or F. In one embodiment, the stepped dielectric material portion 65 has a stepwise-increasing lateral extent that increases with a vertical distance from the carrier substrate 9.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
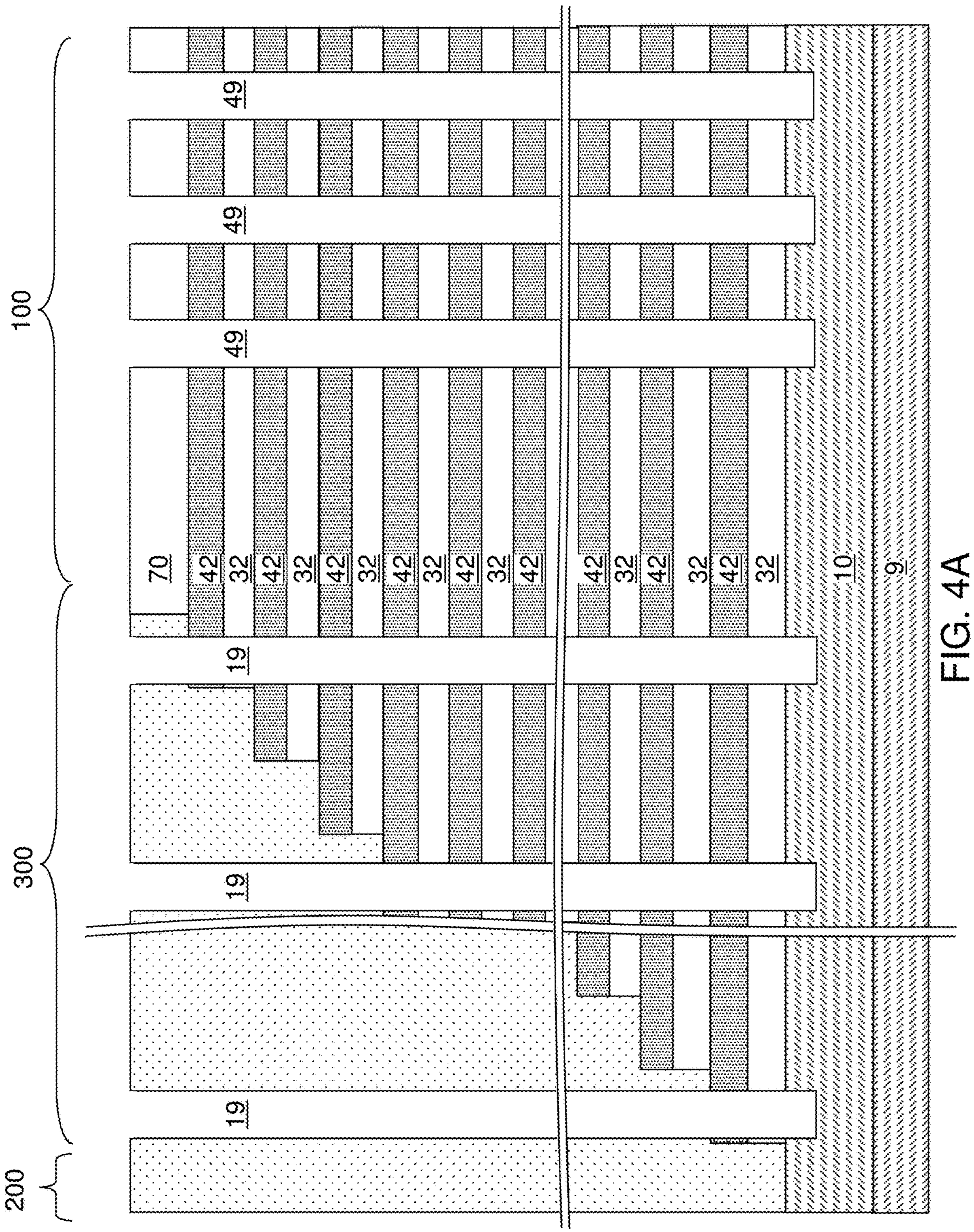
FIG. 4A is a schematic vertical cross-sectional view of the exemplary structure after formation of memory openings and support openings according to an embodiment of the present disclosure.
Figure 4B:
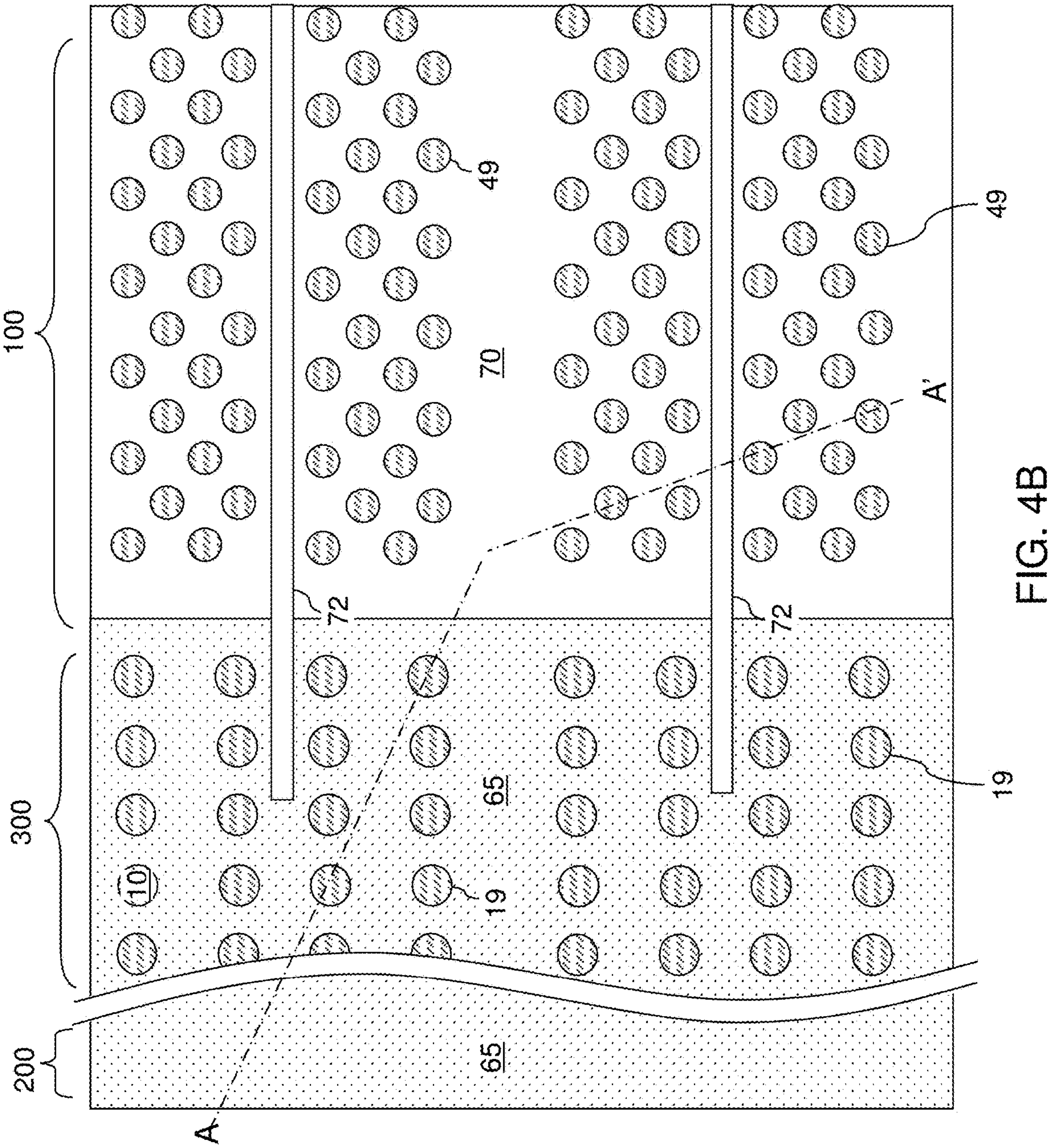
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be used. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300.

FIGS. 5A-5E are sequential schematic vertical cross-sectional views of a memory opening within the exemplary structure during formation of a first exemplary memory opening fill structure therein according to an embodiment of the present disclosure. The same structural change occurs simultaneously in each of the other memory openings 49 and in each support opening 19.

Figure 5B:
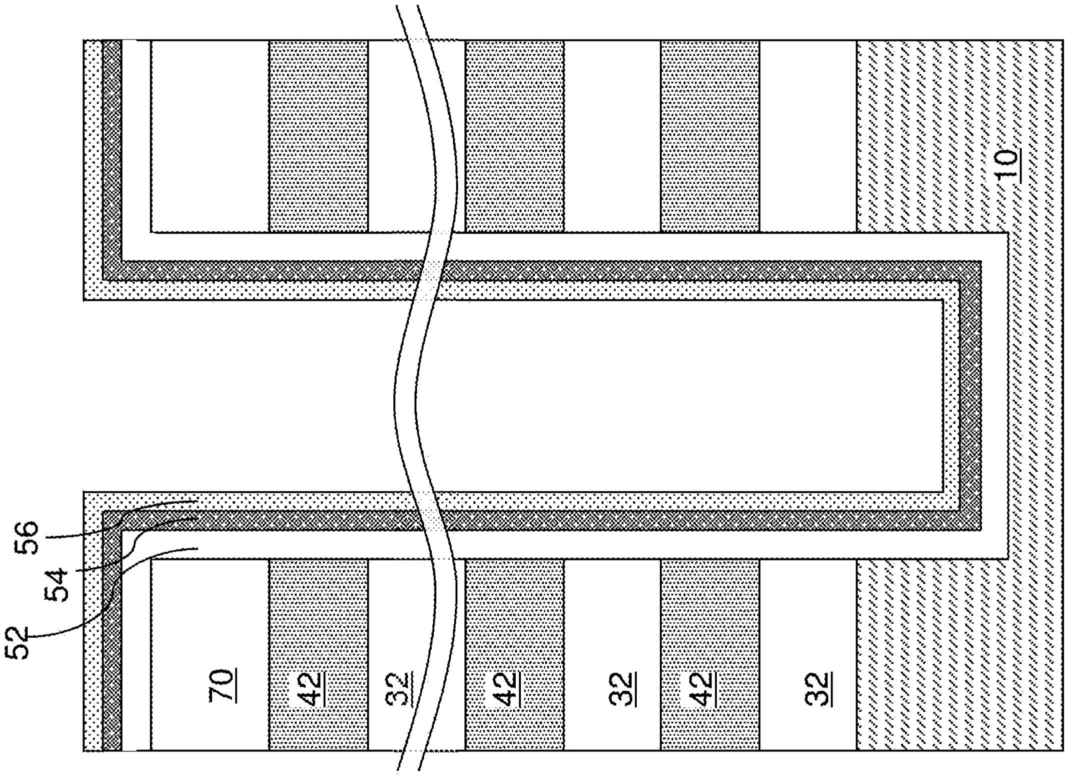
FIGS. 5A-5E are sequential schematic vertical cross-sectional views of a memory opening within the exemplary structure during formation of a first exemplary memory opening fill structure therein according to an embodiment of the present disclosure.
Figure 5A:
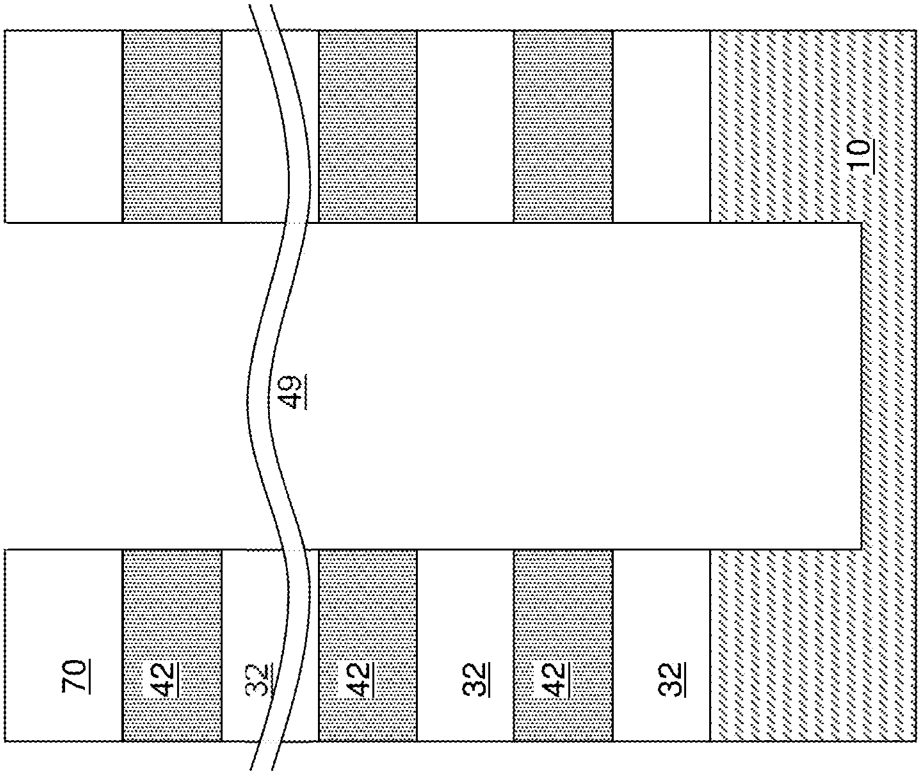

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the stepped dielectric material portion 65, a subset of layers in the alternating stack (32, 42), and into the upper portion of the semiconductor material layer 10. The recess depth of the bottom surface of each memory opening with respect to the top surface of the semiconductor material layer 10 can be in a range from 0 nm to 30 nm, although greater recess depths can also be used. Optionally, the sacrificial material layers 42 can be laterally recessed partially to form lateral recesses (not shown), for example, by an isotropic etch.

Referring to FIG. 5B, a stack of layers including a blocking dielectric layer 52, a charge storage layer 54, a tunneling dielectric layer 56 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. The thickness of the blocking dielectric layer 52 can be in a range from 3 nm to 20 nm, although lesser and greater thicknesses can also be used. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be used to form the charge storage layer 54 as a plurality of memory material portions that are vertically spaced apart. While the present disclosure is described using an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used.

Figure 5D:
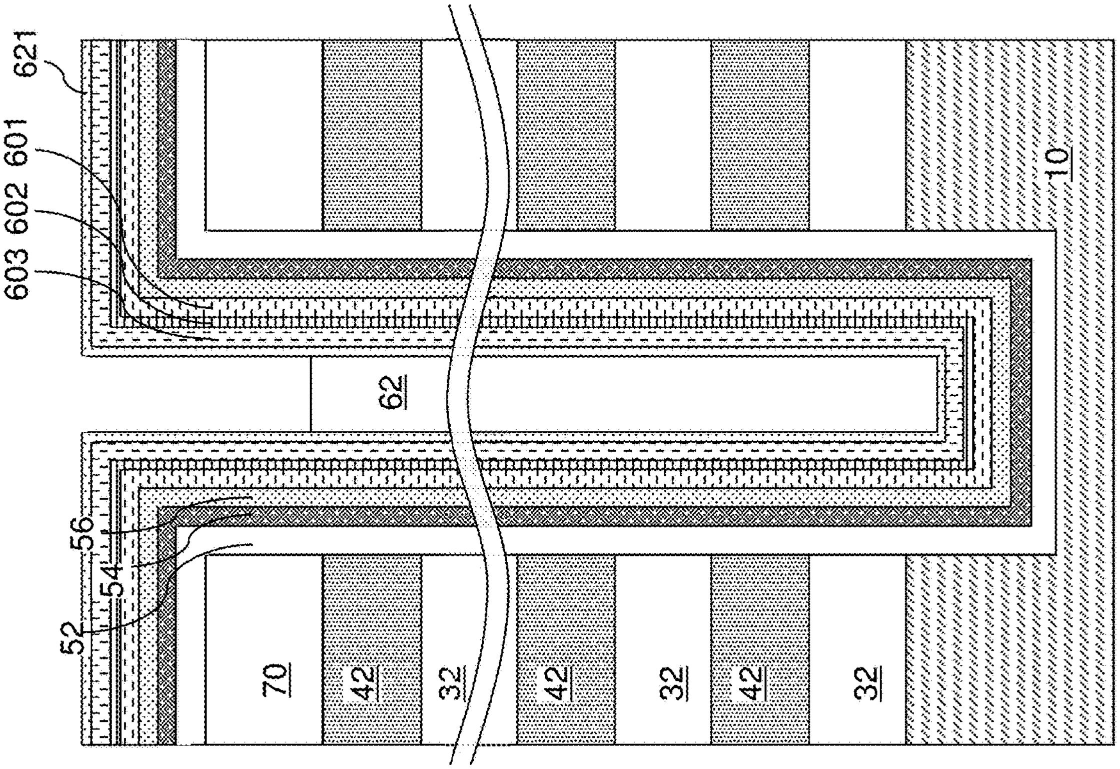
Figure 5C:
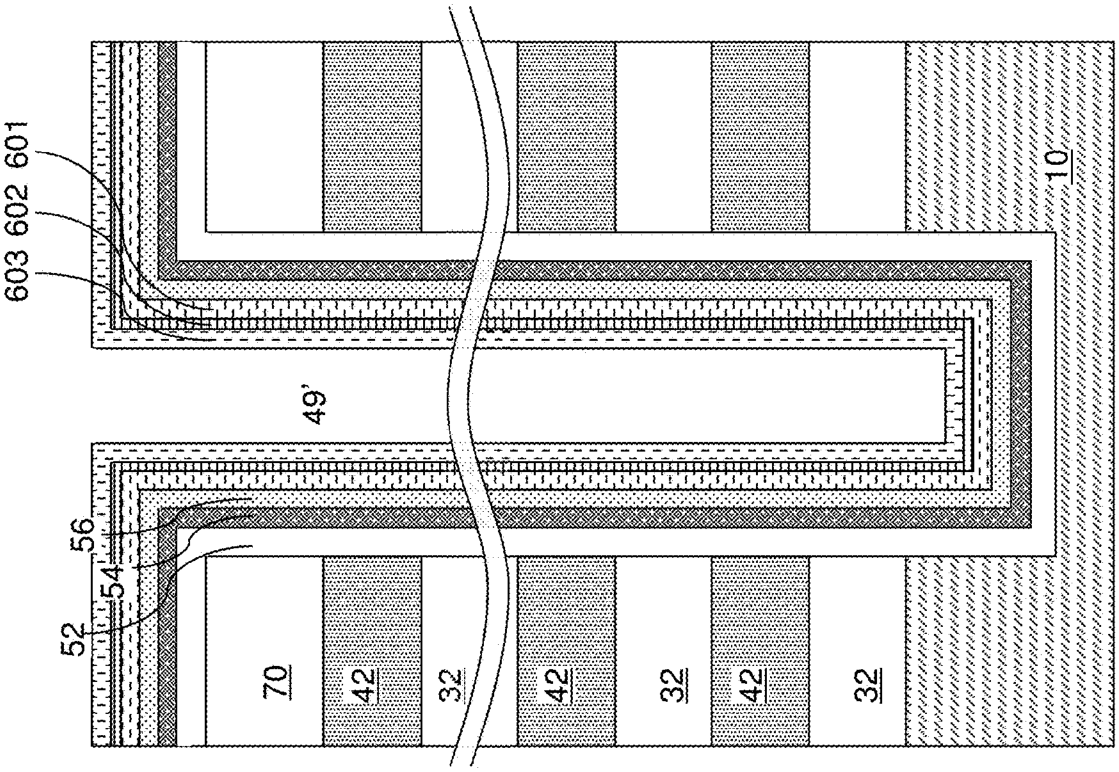

Referring to FIG. 5C and according to an aspect of the present disclosure, a first metal oxide semiconductor layer 601 can be deposited on the physically exposed surfaces of the tunneling dielectric layer 56. In one embodiment, the first metal oxide semiconductor layer 601 comprises an indium tin zinc oxide ("ITZO" layer 601. The indium tin zinc oxide layer 601 may be stoichiometric or non-stoichiometric. Optionally, the indium tin zinc oxide layer 601 may be doped with at least one dopant species such that a total atomic concentration of the at least one dopant species is not greater than 1.0% and/or 0.5% and/or 0.2% and/or 0.1%. In an illustrative example, the indium tin zinc oxide layer 601 may have a composition of $In_{\alpha}Sn_{\beta}\,Zn_{\gamma}O_{\delta}$, in which $\alpha$ is in a range from 0.5 to 1.5, $\beta$ is in a range from 0.5 to 1.5, and $\gamma$ is in a range from 0.5 to 1.5, and $\delta$ is in a range from 3.5 to 5.5. In one embodiment, $\alpha$ is in a range from 0.75 to 1.25, $\beta$ is in a range from 0.75 to 1.25, and $\gamma$ is in a range from 0.75 to 1.25, and $\delta$ is in a range from 4.0 to 5.0. In an illustrative example, a may be about 1, $\beta$ may be about 1, and $\gamma$ may be about 1.

The indium tin zinc oxide layer 601 may be formed by radio frequency (RF) physical vapor deposition (PVD) (i.e., RF sputtering) and/or by direct current (DC) physical vapor deposition (PVD) (i.e., DC sputtering) employing a sintered target including indium, tin, zinc, and optionally oxygen. The atomic ratio of indium, tin, and zinc in the sintered target may be the same as the atomic ratio of indium, tin, and zinc in the indium tin zinc oxide layer 601. In an illustrative example, the atomic ratio of indium, tin, and zinc in the sintered target may be about 1:1:1. The target may contain oxygen or may lack oxygen. If the target contains insufficient oxygen or no oxygen, then the sputtering process may comprise a reactive sputtering process in an oxygen containing ambient. The deposition temperature during the RFPVD process and/or the DCPVD process may be in a range from 250 degrees Celsius to 350 degrees Celsius. The plasma power may be in a range from 150 watts to 250 watts, although lesser and greater plasma powers may be employed depending on the size of the substrate. The deposition pressure may be in a range from 0.2 Pa to 0.6 Pa, although lesser and greater deposition pressures may also be employed. The composition of the gas ambient during deposition may be, for example, 50% argon and 50% oxygen, for reactive sputtering. In one embodiment, DC sputtering and RF sputtering may be alternately performed in a same process chamber by switching the plasma power sources. The RF frequency may be, for example, 13.56 MHz. While composite metal containing targets (e.g., In—Sn—Zn or In—Sn—Zn—)) targets are described above, plural separate targets containing one or two of the above metals may be used, such as a combination of In—Sn—O target and a ZnO target for example.

Generally, any alternative deposition process may be employed in lieu of the RFPVD and/or DCPVD processes to form the indium tin zinc oxide layer 601. For example, chemical vapor deposition (CVD), atomic layer deposition (ALD), and/or pulsed laser deposition (PLD) may be employed in lieu of, and/or in combination with, the RFPVD process and/or the DCPVD process. The thickness of the indium tin zinc oxide layer 601 may be in a range from 1 nm to 4 nm, such as from 1.5 nm to 3 nm, although lesser and greater thicknesses may also be employed. The indium tin zinc oxide layer 601 may be conformal or non-conformal.

A second metal oxide semiconductor layer 602 can be optionally deposited on the indium tin zinc oxide layer 601. The second metal oxide semiconductor layer 602 may comprise an indium gallium tin zinc oxide (IGTZO) layer. The indium gallium tin zinc oxide layer 602 may be stoichiometric or non-stoichiometric. Optionally, the indium gallium tin zinc oxide layer 602 may be doped with at least one dopant species such that a total atomic concentration of the at least one dopant species is not greater than 1.0% and/or 0.5% and/or 0.2% and/or 0.1%. In an illustrative example, the indium gallium tin zinc oxide layer 602 may have a composition of $In_{\alpha}Sn_{\beta\eta}Ga_{\beta(1-\eta)}Zn_{\gamma}O_{\delta}$, in which α is in a range from 0.5 to 1.5, β is in a range from 0.5 to 1.5, and 7 is in a range from 0.5 to 1.5, and δ is in a range from 3.5 to 5.5. The value of η may continuously decrease within a distance from the indium tin zinc oxide layer 601. In an illustrative example, the value of η may continuously decrease from 1 to 0 with an increase in the distance from the indium tin zinc oxide layer 601. In one embodiment, a is in a range from 0.75 to 1.25, β is in a range from 0.75 to 1.25, and γ is in a range from 0.75 to 1.25, and δ is in a range from 4 to 5 In an illustrative example, α may be about 1, β may be about 1, and γ may be about 1.

The indium gallium tin zinc oxide layer 602 may be formed by radio frequency (RF) physical vapor deposition (PVD) and/or by direct current (DC) physical vapor deposition (PVD) employing a dual target system that employs a first sintered target including indium, tin, zinc, and optionally oxygen and a second sintered target including indium, gallium, zinc, and optionally oxygen. In this case, the sputtering rate from the first target may continuously decrease, and the sputtering rate from the second target may continuously increase during the deposition process or the substrate may be moved laterally in a direction from the first target to the second target in the sputtering chamber. The atomic ratio of indium, tin, and zinc in the first sintered target may be the same as the atomic ratio of indium, tin, and zinc in the indium tin zinc oxide layer 601. The atomic ratio of indium, gallium, and zinc in the second sintered target may be the same as the atomic ratio of indium, gallium, and zinc in a tin-free surface layer of the indium gallium tin zinc oxide layer 602, which may be the last monolayer to be deposited. In an illustrative example, the atomic ratio of indium, tin, and zinc in the first sintered target may be about 1:1:1. The atomic ratio of indium, gallium, and zinc in the second sintered target may be about 1:1:1. Other target compositions including one or two metals may also be used as described above. The deposition temperature during the RFPVD process and/or the DCPVD process may be in a range from 250 degrees Celsius to 350 degrees Celsius. The plasma power may be in a range from 150 watts to 250 watts, although lesser and greater plasma powers may be employed depending on the size of the substrate. The deposition pressure may be in a range from 0.2 Pa to 0.6 Pa, although lesser and greater deposition pressures may also be employed. As described above, the sputtering may be reactive sputtering in an oxygen ambient or non-reactive sputtering without an oxygen ambient if sufficient oxygen is provided in the targets. The composition of the gas ambient during deposition may be, for example, 50% argon and 50% oxygen. In one embodiment, DC sputtering and RF sputtering may be alternately performed in a same process chamber by switching the plasma power sources. The RF frequency may be, for example, 13.56 MHz.

Generally, any alternative deposition process may be employed in lieu of the RFPVD and/or DCPVD processes to form the indium gallium tin zinc oxide layer 602. For example, chemical vapor deposition (CVD), atomic layer deposition (ALD), and/or pulsed laser deposition (PLD) may be employed in lieu of, and/or in combination with, the RFPVD process and/or the DCPVD process. In one embodiment, the indium gallium tin zinc oxide layer 602 may be formed by atomic layer deposition with a modulation in the ratio of tin to gallium in the reactant gas stream during the deposition process. In other words, the material composition of the indium gallium tin zinc oxide layer 602 may be modulated by decreasing Sn content and increasing Ga content over the deposition cycles. The thickness of the indium gallium tin zinc oxide layer 602 may be in a range from 1 nm to 3 nm, such as from 1.5 nm to 2.5 nm, although lesser and greater thicknesses may also be employed. The indium gallium tin zinc oxide layer 602 may be conformal or non-conformal. In an alternative embodiment, indium gallium tin zinc oxide layer 602 may be omitted.

A third metal oxide semiconductor layer 603 can be deposited on the surface of the second metal oxide semiconductor layer 602 (if present) or the first metal oxide semiconductor layer 601 if layer 602 is omitted. The third metal oxide semiconductor layer 603 may comprise an indium gallium zinc oxide (IGZO) layer 603. The indium gallium zinc oxide layer 603 may be stoichiometric or non-stoichiometric. Optionally, the indium gallium zinc oxide layer 603 may be doped with at least one dopant species such that a total atomic concentration of the at least one dopant species is not greater than 1.0% and/or 0.5% and/or 0.2% and/or 0.1%. In an illustrative example, the indium gallium zinc oxide layer 603 may have a composition of $In_{\alpha}Ga_{\beta}\ Zn_{\gamma}O_{\delta}$, in which α is in a range from 0.5 to 1.5, β is in a range from 0.5 to 1.5, and γ is in a range from 0.5 to 1.5, and δ is in a range from 3.5 to 5.5. In one embodiment, α is in a range from 0.75 to 1.25, β is in a range from 0.75 to 1.25, and γ is in a range from 0.75 to 1.25, and δ is in a range from 4.0 to 5.0. In an illustrative example, α may be about 1, β may be about 1, and 7 may be about 1.

The indium gallium zinc oxide layer 603 may be formed by radio frequency (RF) physical vapor deposition (PVD) and/or by direct current (DC) physical vapor deposition (PVD) employing a sintered target including indium, gallium, zinc, and optionally oxygen. The atomic ratio of indium, gallium, and zinc in the sintered target may be the same as the atomic ratio of indium, gallium, and zinc in the indium gallium zinc oxide layer 603. In an illustrative example, the atomic ratio of indium, gallium, and zinc in the sintered target may be about 1:1:1. Other target compositions including one or two metals may also be used as described above. The deposition temperature during the RFPVD process and/or the DCPVD process may be in a range from 250 degrees Celsius to 350 degrees Celsius. The plasma power may be in a range from 150 watts to 250 watts, although lesser and greater plasma powers may be employed depending on the size of the substrate. The deposition pressure may be in a range from 0.2 Pa to 0.6 Pa, although lesser and greater deposition pressures may also be employed. As described above, the sputtering may be reactive sputtering in an oxygen ambient or non-reactive sputtering without an oxygen ambient if sufficient oxygen is provided in the targets. The composition of the gas ambient during deposition may be, for example, 50% argon and 50% oxygen. In one embodiment, DC sputtering and RF sputtering may be alternately performed in a same process chamber by switching the plasma power sources. The RF frequency may be, for example, 13.56 MHz.

Generally, any alternative deposition process may be employed in lieu of the RFPVD and/or DCPVD processes to form the indium gallium zinc oxide layer 603. For example, chemical vapor deposition (CVD), atomic layer deposition (ALD), and/or pulsed laser deposition (PLD) may be employed in lieu of, and/or in combination with, the RFPVD process and/or the DCPVD process. The thickness of the indium gallium zinc oxide layer 603 may be in a range from 3 nm to 10 nm, such as from 4 nm to 9 nm and/or from 5 nm to 8 nm, although lesser and greater thicknesses may also be employed. The indium gallium zinc oxide layer 603 may be conformal or non-conformal. A memory cavity 49' may be present within each memory opening 49. The memory cavity 49' is an unfilled volume, i.e., a void, within the respective memory opening 49.

Referring to FIG. 5D, an optional interfacial dielectric liner 621 may be optionally formed on the indium gallium zinc oxide layer 603. The interfacial dielectric liner 621 includes a dielectric material that can improve charge carrier mobility within the indium gallium zinc oxide layer 603 by reducing the density of surface defects in the indium gallium zinc oxide layer 603. For example, the interfacial dielectric liner 621 may include a dielectric metal oxide, such as aluminum oxide. The thickness of the interfacial dielectric liner 621 may be in a range from 2 nm to 4 nm, although lesser and greater thicknesses may also be employed.

A dielectric core layer can be deposited in the memory cavity 49'. The dielectric core layer includes a dielectric material, such as silicon oxide or organosilicate glass. The dielectric core layer can be deposited by a conformal deposition method such as low pressure chemical vapor deposition (LPCVD), or by a self-planarizing deposition process such as spin coating. Subsequently, the dielectric core layer can be recessed selective to the material of the indium gallium zinc oxide layer 603, for example, by a recess etch. The material of the dielectric core layer can be vertically recessed below the horizontal plane including the top surface of the insulating cap layer 70. Each remaining portion of the dielectric core layer constitutes a dielectric core 62.

Figure 5E:
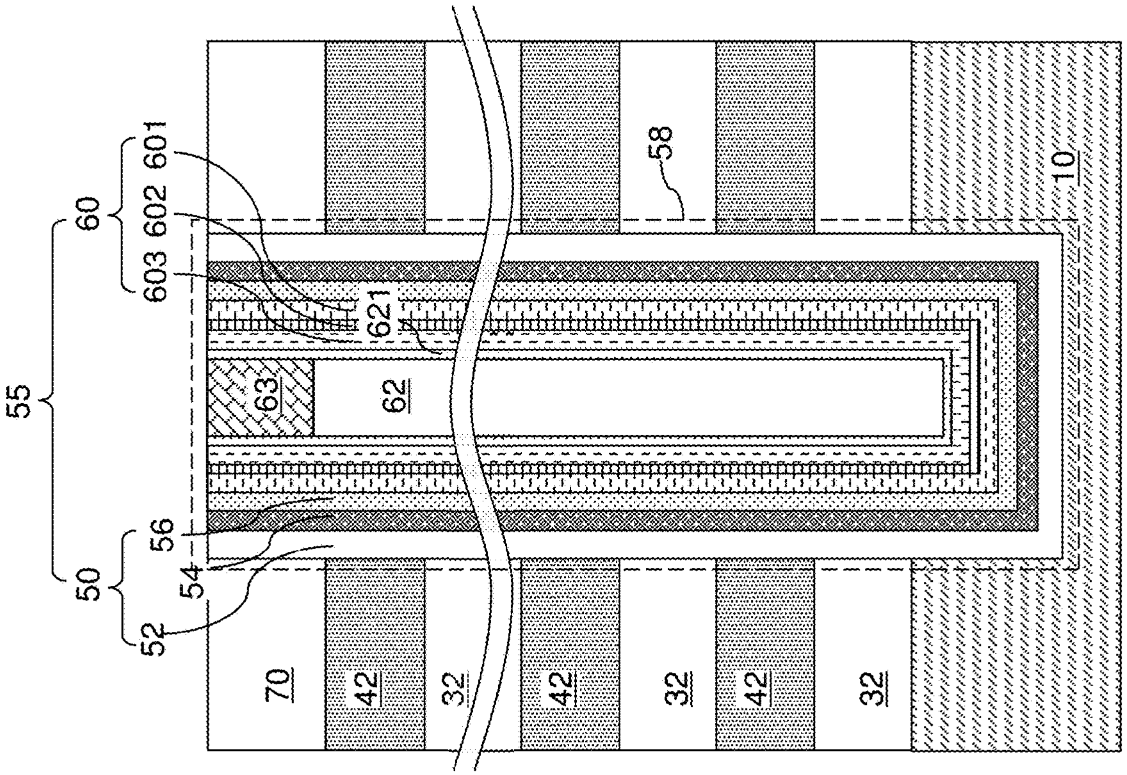

Referring to FIG. 5E, a doped semiconductor material can be deposited within each recessed region above the dielectric cores 62. In one embodiment, the indium tin zinc oxide layer 601, the indium gallium tin zinc oxide layer 602, and the indium gallium zinc oxide layer 603 may have a doping of a first conductivity type (such as p-type or n-type), and the deposited doped semiconductor material may have a doping of a second conductivity type that is the opposite of the first conductivity type. For example, if the first conductivity type is p-type, the second conductivity type is n-type, and vice versa. In one embodiment, the doped semiconductor material may be deposited as an amorphous semiconductor material or as a polycrystalline semiconductor material. The doped semiconductor material may include at least one elemental semiconductor material (such as silicon and/or germanium), or may comprise a compound semiconductor material (such as indium arsenide or indium antimonide), or may comprise a heavily doped metal oxide semiconductor material that is conductive, i.e. having electrical conductivity greater than $1.0\times10^5$ S/cm. The dopant concentration in the doped semiconductor material having a doping of the second conductivity type can be in a range from $5.0\times10^{18}/cm^3$ to $2.0\times10^{21}/cm^3$, although lesser and greater dopant concentrations can also be used.

A planarization process can be performed to remove portions of the doped semiconductor material having a doping of the second conductivity type, the indium tin zinc oxide layer 601, the indium gallium tin zinc oxide layer 602, the indium gallium zinc oxide layer 603, the tunneling dielectric layer 56, the charge storage layer 54, and the blocking dielectric layer 52 from above the horizontal plane including the top surface of the insulating cap layer 70, for example, by chemical mechanical planarization (CMP) or a recess etch. Each remaining portion of the semiconductor material having a doping of the second conductivity type constitutes a drain region 63.

Each of the indium tin zinc oxide layer 601, the optional indium gallium tin zinc oxide layer 602, the indium gallium zinc oxide layer 603, the tunneling dielectric layer 56, the charge storage layer 54, and the blocking dielectric layer 52 is divided into a respective set of discrete layers located within a respective one of the memory openings 49 or within a respective one of the support openings 19. Specifically, the indium tin zinc oxide layer 601 as provided at the processing steps of FIG. 5D is divided into a plurality of indium tin zinc oxide layers 601. The indium gallium tin zinc oxide layer 602 (if present) as provided at the processing steps of FIG. 5D is divided into a plurality of indium gallium tin zinc oxide layers 602. The indium gallium zinc oxide layer 603 as provided at the processing steps of FIG. 5D is divided into a plurality of indium gallium zinc oxide layers 603. The tunneling dielectric layer 56 as provided at the processing steps of FIG. 5D is divided into a plurality of tunneling dielectric layers 56. The charge storage layer 54 as provided at the processing steps of FIG. 5D is divided into a plurality of charge storage layers 54. The blocking dielectric layer 52 as provided at the processing steps of FIG. 5D is divided into a plurality of blocking dielectric layers 52. The interfacial dielectric liner 621 as provided at the processing steps of FIG. 5D is divided into a plurality of interfacial dielectric liners 621.

Each contiguous combination of an indium tin zinc oxide layer 601, an indium gallium tin zinc oxide layer 602 (if present), and an indium gallium zinc oxide layer 603 located within a respective memory opening 49 constitutes a vertical channel 60. Electrical current can flow through each vertical channel 60 when a vertical NAND device including the vertical channel 60 is turned on. Each contiguous combination of a blocking dielectric layer 52, a charge storage layer 54, and a tunneling dielectric layer 56 located within a respective memory opening constitutes a memory film 50, which can store electrical charges with a macroscopic retention time. As used herein, a macroscopic retention time refers to a retention time suitable for operation of a memory device as a permanent memory device such as a retention time in excess of 24 hours.

Generally, the memory film 50 includes a vertical stack of memory elements that can store information at levels of the sacrificial material layers 42. For example, the vertical stack of memory elements may comprise portions of a charge storage layer 54 located at the levels of the sacrificial material layers 42. In one embodiment, the tunneling dielectric layer 56 laterally surrounds the vertical channel 60, the vertical stack of memory elements (which may comprise portions of the charge storage layer 54) laterally surrounds the tunneling dielectric layer 56, and the blocking dielectric layer 52 laterally surrounds the vertical stack of memory elements. In some embodiments, a blocking dielectric layer 52 may not be present in the memory film 50 at this step, and a blocking dielectric layer may be subsequently formed after formation of backside recesses. Each combination of a memory film 50 and a vertical channel 60 constitutes a memory stack structure 55. The set of all material portions located within a memory opening 49 constitutes a memory opening fill structure 58. The set of all material portions located within a support opening 19 constitutes a support pillar structure.

An anneal process can be performed to crystallize the semiconducting materials of the indium tin zinc oxide layer 601, the indium gallium tin zinc oxide layer 602, and the indium gallium zinc oxide layer 603 within each vertical channel 60, and optionally to crystallize the semiconductor material of the drain region 63 in case the drain region includes an amorphous semiconductor material. The anneal process may be performed, for example, at an elevated temperature in a range from 600 degrees Celsius to 700 degrees Celsius, such as from 620 degrees Celsius to 650 degrees Celsius, although higher and lower temperatures may also be employed. The duration of the anneal process may be, for example, in a range from 10 minutes to 120 minutes, such as from 20 minutes to 60 minutes, although a shorter or longer duration may also be employed.

Crystalline (e.g., polycrystalline) indium tin zinc oxide material in the indium tin zinc oxide layer 601 has a band gap of about 3.40 eV. Crystalline indium gallium zinc oxide material in the indium gallium zinc oxide layer 603 has a band gap of about 3.81 eV. The material composition of the crystalline indium gallium tin zinc oxide material in the indium gallium tin zinc oxide layer 602 (if present) is graded, and the band gap of the indium gallium tin zinc oxide layer 602 gradually increases from 3.40 eV to 3.81 eV from the interface with the indium tin zinc oxide layer 601 to the interface with the indium gallium zinc oxide layer 603.

In one embodiment, the indium tin zinc oxide layer 601, the indium gallium tin zinc oxide layer 602, and the indium gallium zinc oxide layer 603 within each vertical channel 60 may be n-doped. In this case, the donor atomic concentration in the indium tin zinc oxide layer 601 may be in a range from $1\times10^{18}/cm^3$ to $1\times10^{19}/cm^3$, such as from $3\times10^{18}/cm^3$ to $5\times10^{18}/cm^3$, although lesser and greater donor atomic concentrations may also be employed. The donor atomic concentration in the indium gallium zinc oxide layer 603 may be in a range from $1\times10^{16}/cm^3$ to $1\times10^{18}/cm^3$, such as from $3\times10^{16}/cm^3$ to $3\times10^{17}/cm^3$, although lesser and greater donor atomic concentrations may also be employed. The donor atomic concentration in the indium gallium tin zinc oxide layer 602 gradually changes from the level of the donor atomic concentration in the indium tin zinc oxide layer 601 to the level of the donor atomic concentration in the indium gallium tin zinc oxide layer 602 with a distance from the indium tin zinc oxide layer 601.

The non-uniform donor atomic concentration profile within the vertical channel 60 can provide a higher on-current while suppressing leakage current, thereby providing overall enhanced channel characteristics for the vertical channel 60. Specifically, the layer stack including the indium tin zinc oxide layer 601, the optional indium gallium tin zinc oxide layer 602, and the indium gallium zinc oxide layer 603 can provide a higher charge carrier mobility, a lower sub-threshold slope (SS), and as a consequence, a higher on-off current ratio than a semiconducting channel including a single semiconducting metal oxide material, such as indium gallium zinc oxide. The conduction band off-set between indium tin zinc oxide and indium gallium zinc oxide contributes to better electron confinement, and higher mobility for the vertical channel. For example, composite channel mobility of the vertical channel 60 of an embodiment of the present disclosure may be in a range from 20 $cm^2/Vs$ to 40 $cm^2/Vs$, which is about 5 to 10 times higher than the channel mobility of a channel consisting of indium gallium zinc oxide alone.

Figure 6B:
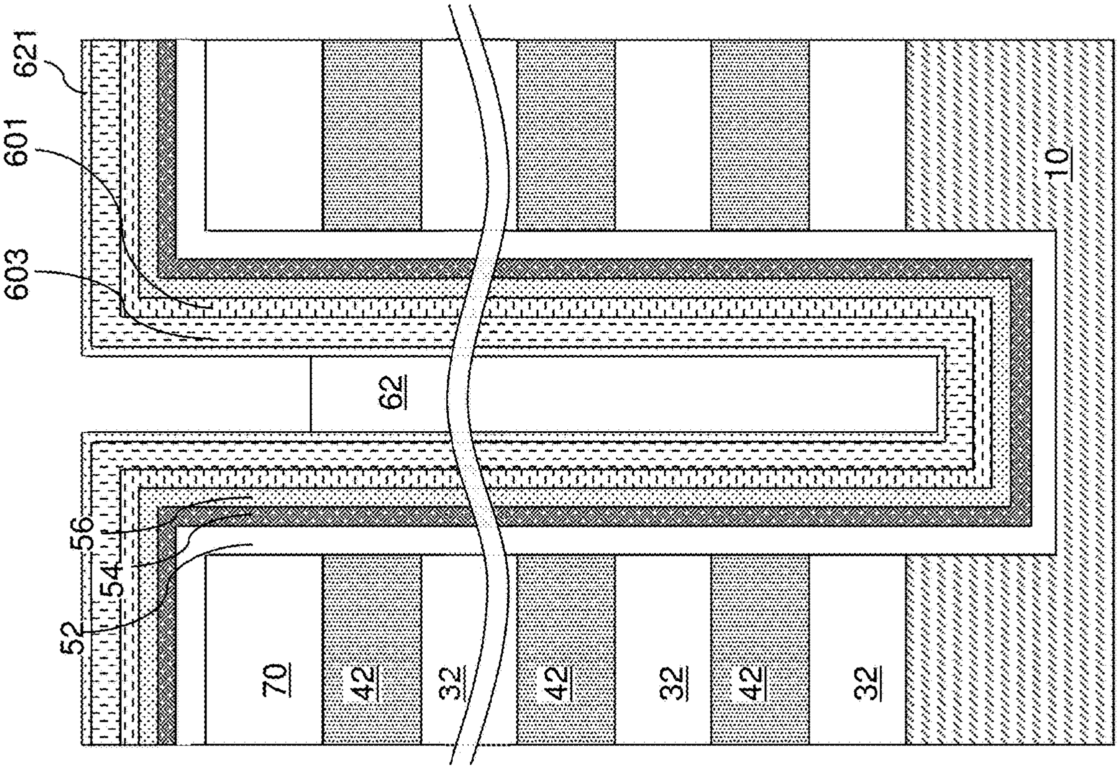
FIGS. 6A-6C are sequential schematic vertical cross-sectional views of a memory opening within the exemplary structure during formation of a second exemplary memory opening fill structure therein according to an embodiment of the present disclosure.
Figure 6A:
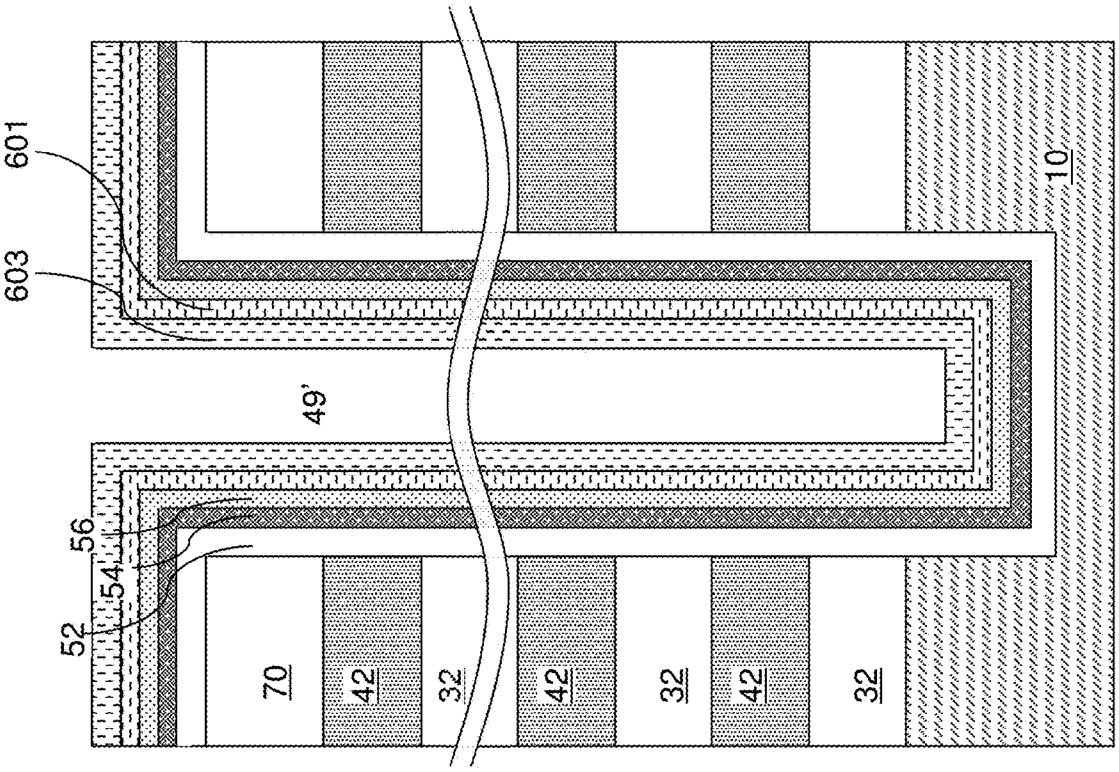
Figure 6C:
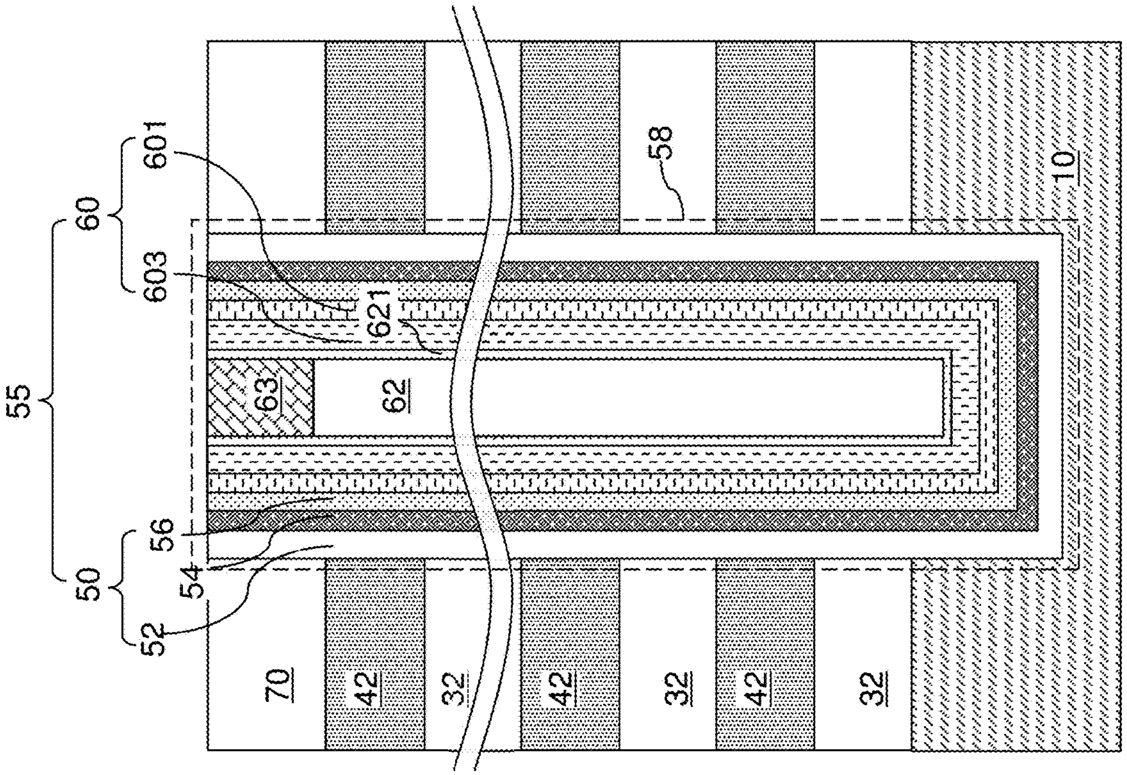

FIGS. 6A-6C are sequential schematic vertical cross-sectional views of a memory opening 49 within the exemplary structure during formation of a second exemplary memory opening fill structure 58 therein according to an embodiment of the present disclosure. Generally, the second exemplary memory opening fill structure 58 can be derived from the first exemplary memory opening fill structure 58 illustrated in FIG. 5E by omitting formation of the optional indium gallium tin zinc oxide layer 602.

Referring to FIG. 6A, an alternative configuration of the exemplary structure can be derived from the configuration of the exemplary structure illustrated in FIG. 5C by omitting formation of the optional indium gallium tin zinc oxide layer 602. In this case, the indium gallium zinc oxide layer 603 can be formed directly on the indium tin zinc oxide layer 601.

Referring to FIG. 6B, the processing steps of FIG. 5D can be performed to optionally form the interfacial dielectric liner 621, and to form the dielectric core 62 within each memory opening 49.

Referring to FIG. 6C, the processing steps of FIG. 5E can be performed to form a memory opening fill structure 58 in each memory opening 49.

Figure 7:
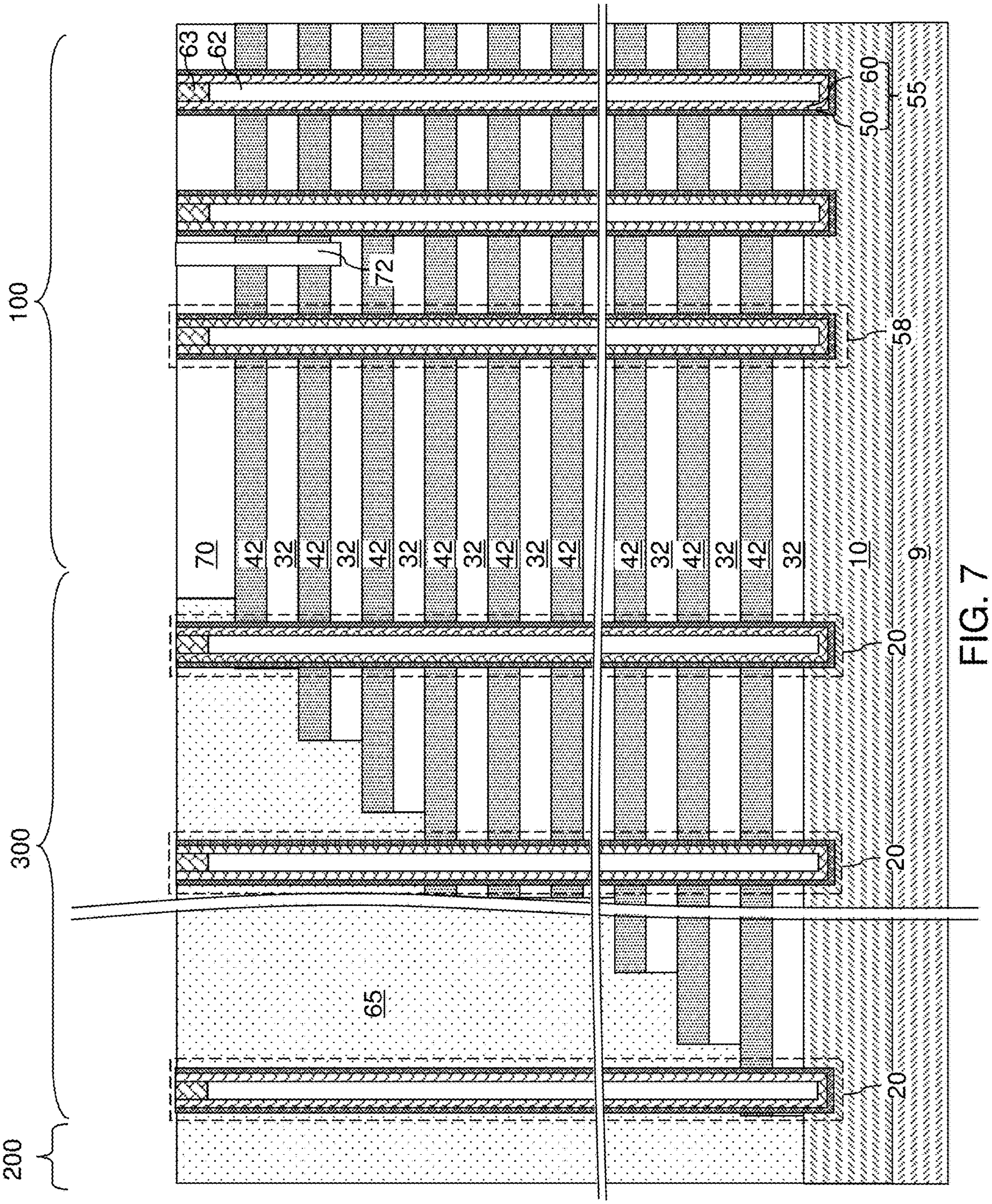
FIG. 7 is a schematic vertical cross-sectional view of the exemplary structure after formation of memory opening fill structures and support pillar structures according to an embodiment of the present disclosure.

Referring to FIG. 7, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B. The support pillar structures 20 are formed through a region of the alternating stack (32, 42) that underlie the stepped surfaces and a region of the stepped dielectric material portion 65 that overlie the stepped surfaces. Each of the support pillar structures 20 comprises a semiconductor material portion (i.e., a vertical channel 60 of the support pillar structure 20) having a same composition as the vertical channels 60 of the memory opening fill structures 58, and a dielectric layer stack (i.e., a memory film 50 of a support pillar structure 20) containing a same set of dielectric material layers as each of the memory films 50 of the memory opening fill structures 58. While the present disclosure is described using the illustrated configuration for the memory stack structure, the methods of the present disclosure can be applied to alternative memory stack structures including different layer stacks or structures for the memory film 50.

Referring collectively to FIGS. 5E, 6C, and 7, a memory opening fill structure 58 is located in each memory opening 49. The memory opening fill structure 58 comprises a memory film 50 and a vertical composite metal oxide semiconductor channel 60 comprising a different composition between its inner and outer portions. In one embodiment, the vertical composite metal oxide semiconductor channel 60 comprises an indium tin zinc oxide layer 601 in the outer portion, and an indium gallium zinc oxide layer 603 in the inner portion. In one embodiment, the composite metal oxide semiconductor channel 60 comprises the indium tin zinc oxide layer 601, the optional indium tin gallium zinc oxide layer 602, and the indium gallium zinc oxide layer 603. In one embodiment, the memory film 50, the indium tin zinc oxide layer 601, the optional indium tin gallium zinc oxide layer, and the indium gallium zinc oxide layer 603 may vertically extend through each sacrificial material layer 42 within the alternating stack. In one embodiment, the atomic concentration of free charge carriers within the indium tin zinc oxide layer 601 is at least three times, and may be at least ten times, an atomic concentration of free charge carriers within the indium gallium zinc oxide layer 603. In one embodiment, the indium tin zinc oxide layer 601 is in direct contact with the memory film 50. In one embodiment, the indium gallium zinc oxide layer 603 is laterally spaced from the memory film 50 by the indium tin zinc oxide layer 601.

In one embodiment, the memory film 50 has a cylindrical inner sidewall that vertically extends through each of the electrically conductive layers 46 within the alternating stack (32, 46). In one embodiment, the indium tin zinc oxide layer 601 comprises a cylindrical outer sidewall that contacts the cylindrical inner sidewall of the memory film 50. In one embodiment, the memory opening fill structure 58 comprises: a vertical channel 60 that includes the indium tin zinc oxide layer 601 and the indium gallium zinc oxide layer 603; and a drain region 63 that is formed at an end of the vertical channel 60 that is distal from the substrate. In one embodiment, the memory film 50 comprises: a tunneling dielectric layer 56 in contact with the indium tin zinc oxide layer 601; a vertical stack of charge storage elements located at levels of the electrically conductive layers 46 (as portions of the charge storage layer 54) and contacting the tunneling dielectric layer 56; and a blocking dielectric layer 52 interposed between the vertical stack of charge storage elements and the electrically conductive layers 46.

In one embodiment, a cylindrical outer sidewall of the indium gallium zinc oxide layer 603 contacts a cylindrical inner sidewall of the indium tin zinc oxide layer 601. Alternatively, the memory opening fill structure 58 comprises an indium gallium tin zinc oxide layer 602 that is interposed between the indium tin zinc oxide layer 601 and the indium gallium zinc oxide layer 603. In one embodiment, the indium gallium tin zinc oxide layer 602 has a radial compositional gradient such that: an atomic concentration of tin decreases with a lateral distance from the indium tin zinc oxide layer 601 within the indium gallium tin zinc oxide layer 602; and an atomic concentration of gallium decreases with a lateral distance from the indium gallium zinc oxide layer 603 within the indium gallium tin zinc oxide layer 602.

Figure 8A:
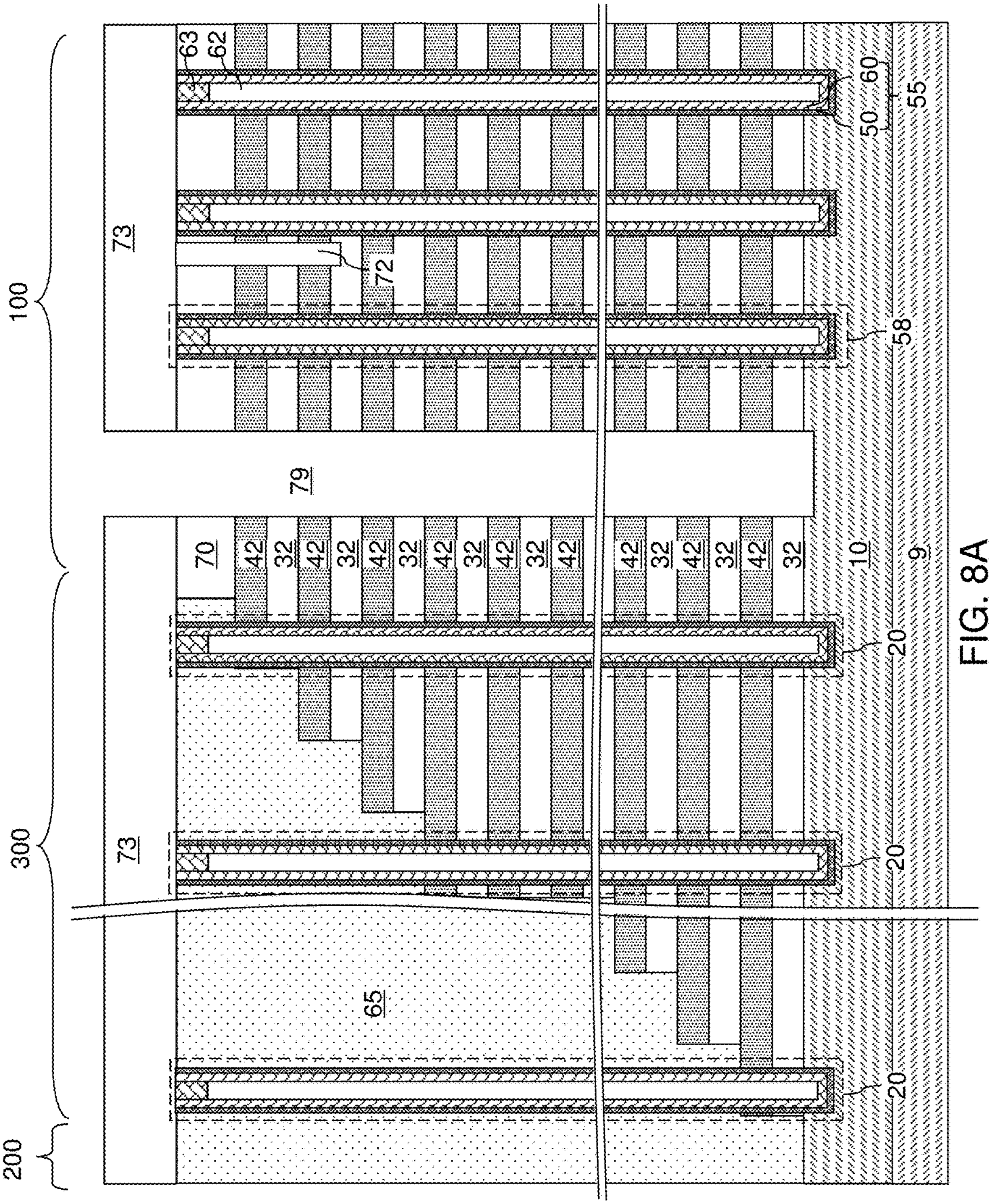
FIG. 8A is a schematic vertical cross-sectional view of the exemplary structure after formation of a contact-level dielectric layer and backside trenches according to an embodiment of the present disclosure.
Figure 8B:
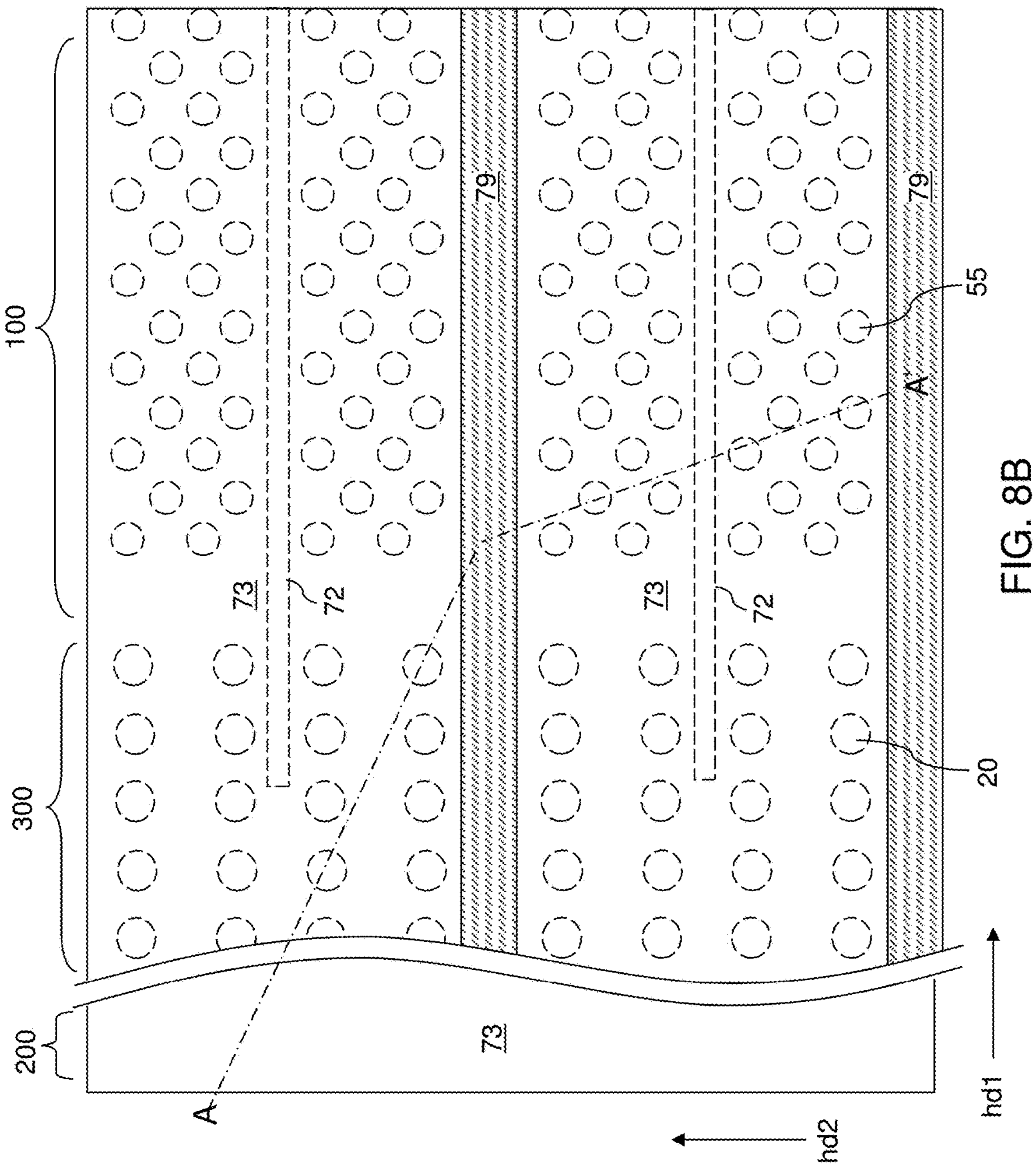
FIG. 8B is a partial see-through top-down view of the exemplary structure of FIG. 8A. The vertical plane A-A' is the plane of the schematic vertical cross-sectional view of FIG. 8A.

Referring to FIGS. 8A and 8B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be used. A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the stepped dielectric material portion 65 using an anisotropic etch to form backside trenches 79, which vertically extend from the top surface of the contact level dielectric layer 73 at least to the top surface of the semiconductor material layer 10, and laterally extend through the memory array region 100 and the staircase region 300.

In one embodiment, the backside trenches 79 can laterally extend along a first horizontal direction hd1 and can be laterally spaced apart one from another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

Figure 9:
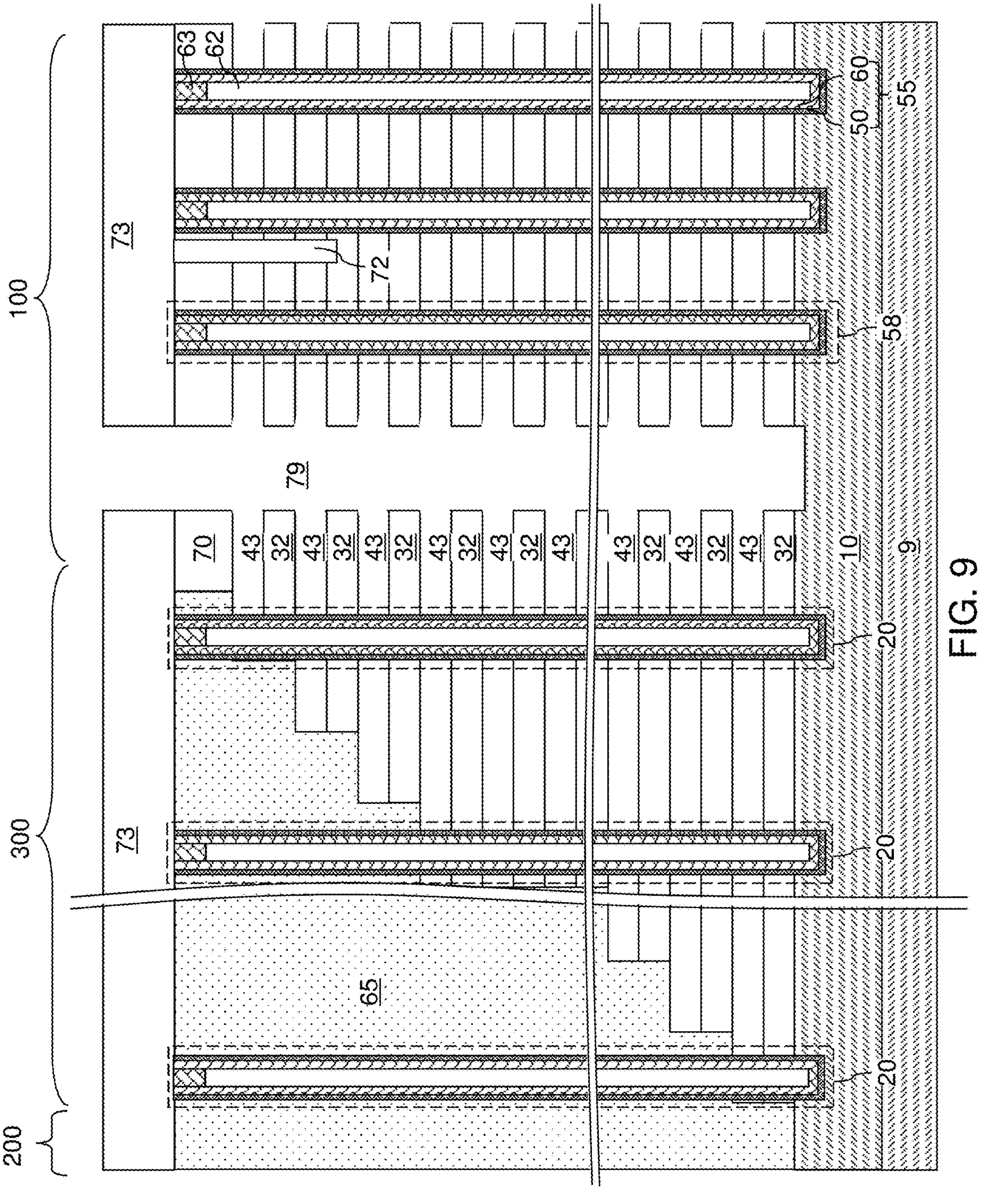
FIG. 9 is a schematic vertical cross-sectional view of the exemplary structure after formation of backside recesses according to an embodiment of the present disclosure.

Referring to FIG. 9, an etchant that selectively etches the second material of the sacrificial material layers 42 with respect to the first material of the insulating layers 32 can be introduced into the backside trenches 79, for example, using an etch process. Backside recesses 43 are formed in volumes from which the sacrificial material layers 42 are removed. The removal of the second material of the sacrificial material layers 42 can be selective to the first material of the insulating layers 32, the material of the stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the stepped dielectric material portion 65 can be selected from silicon oxide and dielectric metal oxides.

The etch process that removes the second material selective to the first material and the outermost layer of the memory films 50 can be a wet etch process using a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials used in the art. The support pillar structure 20, the stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of three-dimensional NAND strings having a plurality of device levels disposed above the semiconductor material layer 10. In this case, each backside recess 43 can define a space for receiving a respective word line of the array of three-dimensional NAND strings. Each of the plurality of backside recesses 43 can extend substantially parallel to the top surface of the semiconductor material layer 10. A backside recess 43 can be vertically bounded by a top surface of an underlying insulating layer 32 and a bottom surface of an overlying insulating layer 32. In one embodiment, each backside recess 43 can have a uniform height throughout.

Figure 10:
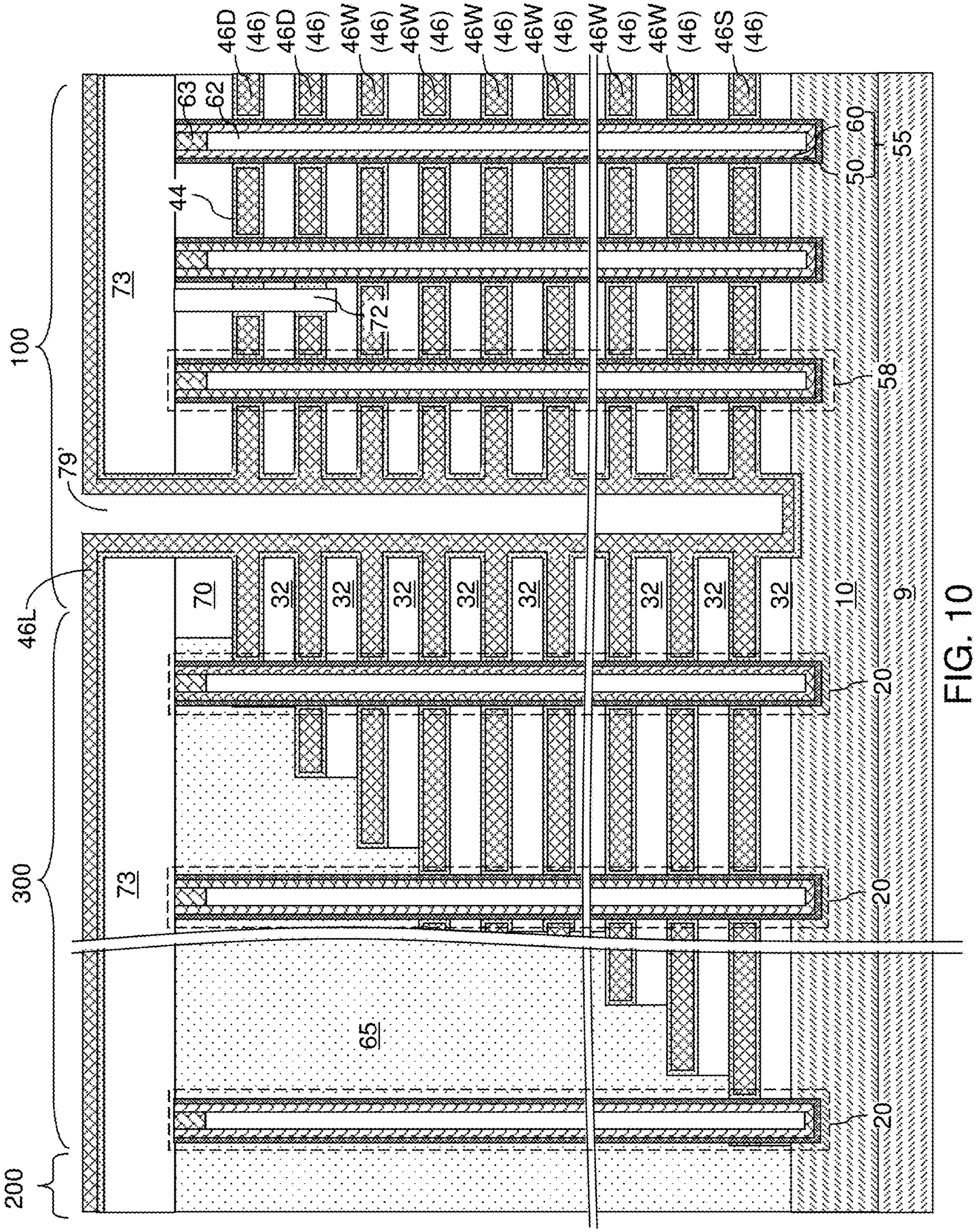
FIG. 10 is a schematic vertical cross-sectional view of the exemplary structure after formation of electrically conductive layers according to an embodiment of the present disclosure.

Referring to FIG. 10, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be used.

At least one metallic material is deposited in the plurality of backside recesses 43, on the sidewalls of the at least one the backside trench 79, and over the top surface of the contact level dielectric layer 73. The at least one metallic material can include a conductive metal nitride material (such as TiN, TaN, or WN) and a metallic fill material (such as W, Co, Ru, Ti, and/or Ta). Each metallic material can be deposited by a conformal deposition method, which can be, for example, chemical vapor deposition (CVD), atomic layer deposition (ALD), electroless plating, electroplating, or a combination thereof.

A plurality of electrically conductive layers 46 can be formed in the plurality of backside recesses 43, and a continuous electrically conductive material layer 46L can be formed on the sidewalls of each backside trench 79 and over the contact level dielectric layer 73. Each electrically conductive layer 46 includes a portion of the metallic barrier layer and a portion of the metallic fill material layer that are located between a vertically neighboring pair of dielectric material layers such as a pair of insulating layers 32. The continuous electrically conductive material layer 46L includes a continuous portion of the metallic barrier layer and a continuous portion of the metallic fill material layer that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L.

Figure 11A:
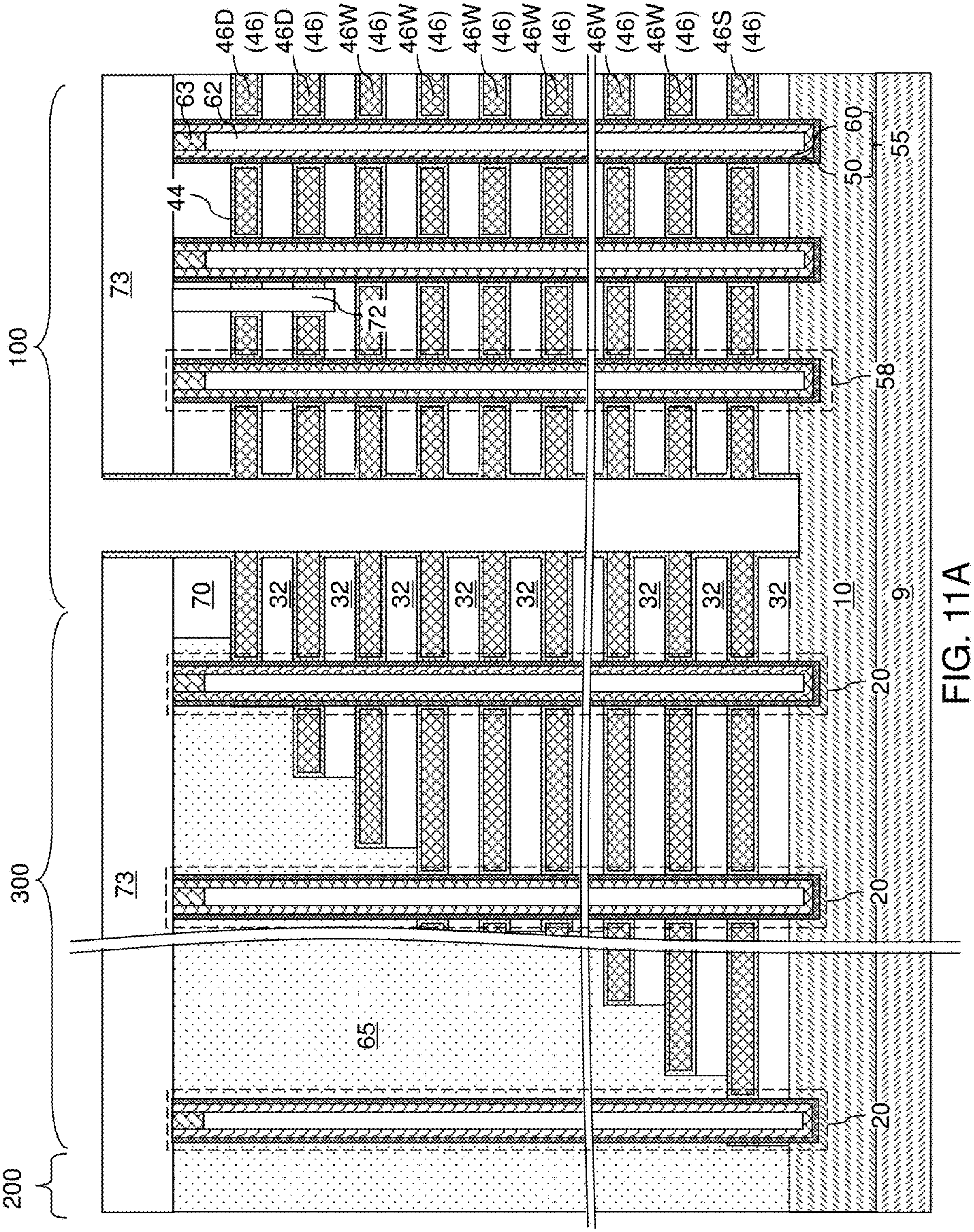
FIG. 11A is a schematic vertical cross-sectional view of the exemplary structure after removal of a deposited conductive material from within the backside trench according to an embodiment of the present disclosure.
Figure 11B:
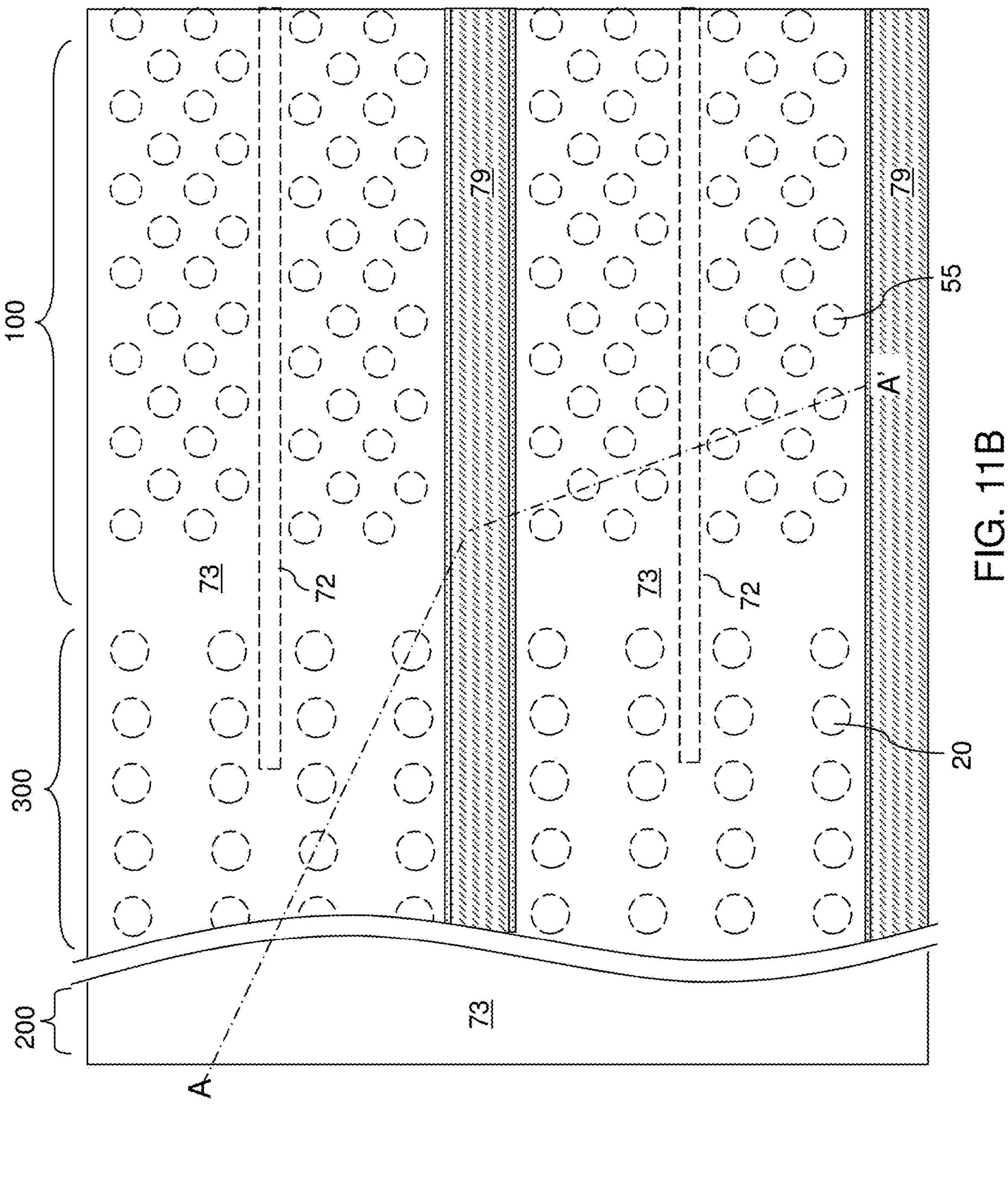
FIG. 11B is a partial see-through top-down view of the exemplary structure of FIG. 11A. The vertical plane A-A' is the plane of the schematic vertical cross-sectional view of FIG. 11A.

Referring to FIGS. 11A and 11B, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be used. A backside cavity 79' is present within each backside trench 79.

Figure 12A:
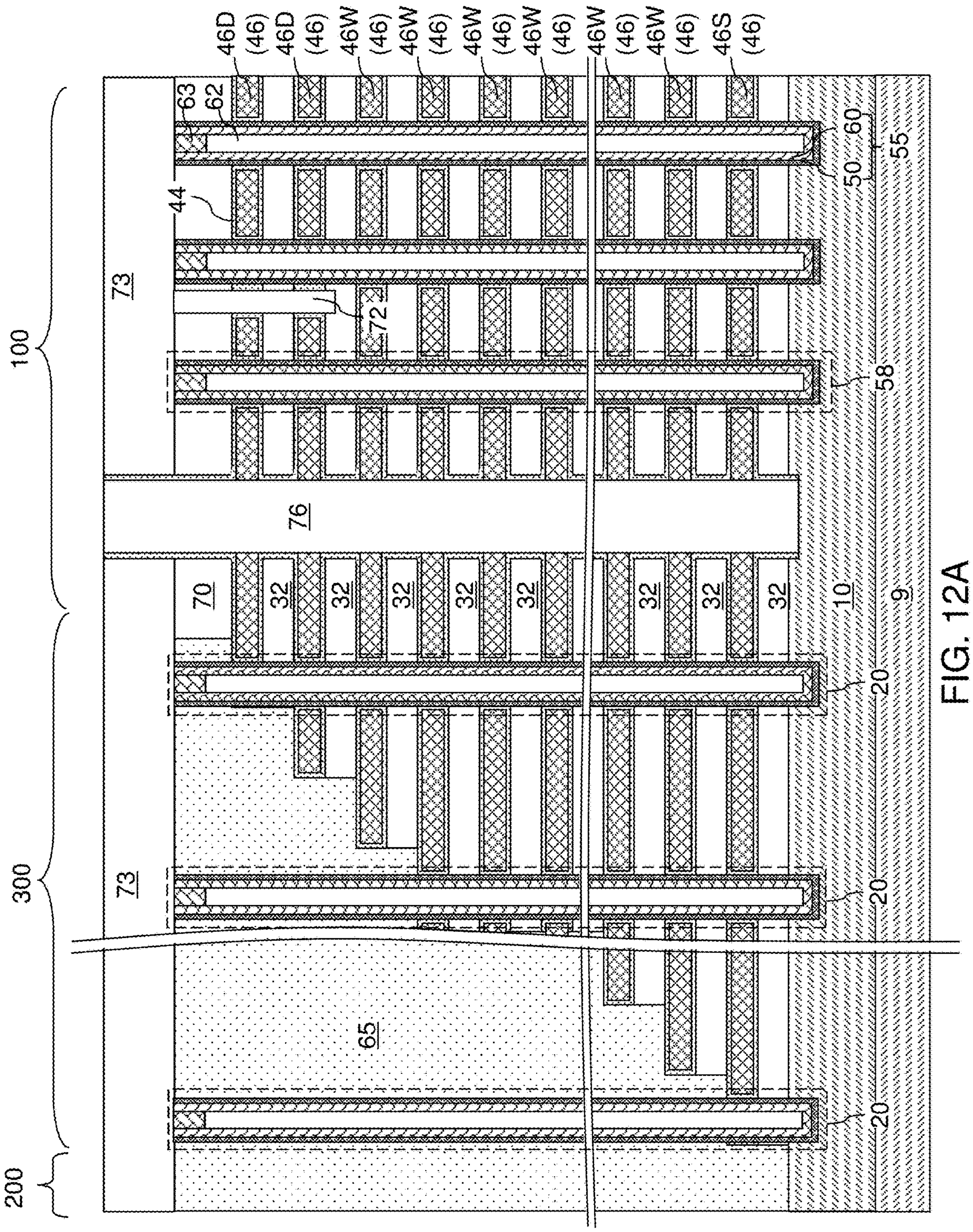
FIG. 12A is a schematic vertical cross-sectional view of the exemplary structure after formation of backside trench fill structures according to an embodiment of the present disclosure.
Figure 12B:
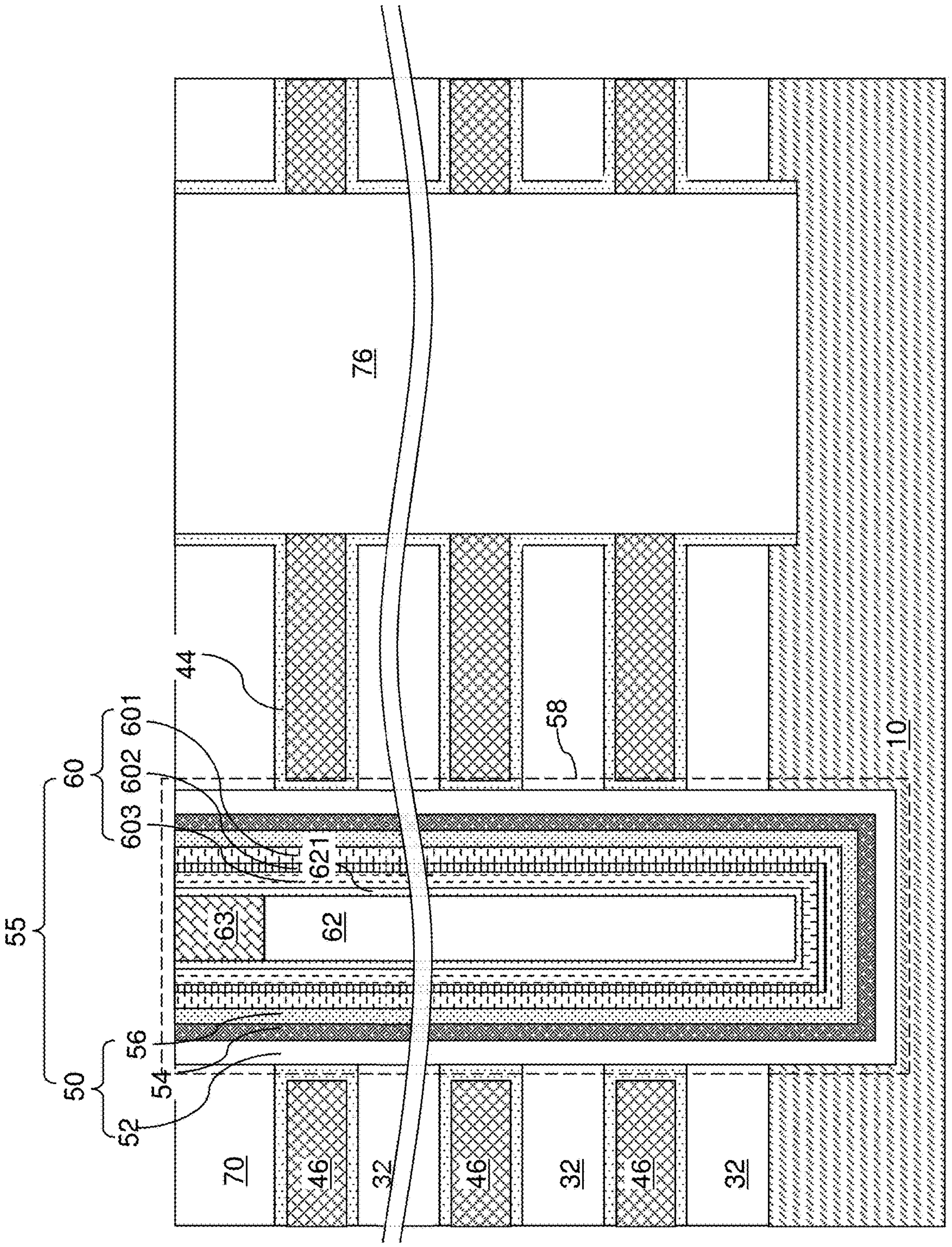
FIG. 12B is a magnified view of a region of the exemplary structure in case first exemplary memory opening fill structures are present in the memory openings according to an embodiment of the present disclosure.
Figure 12C:
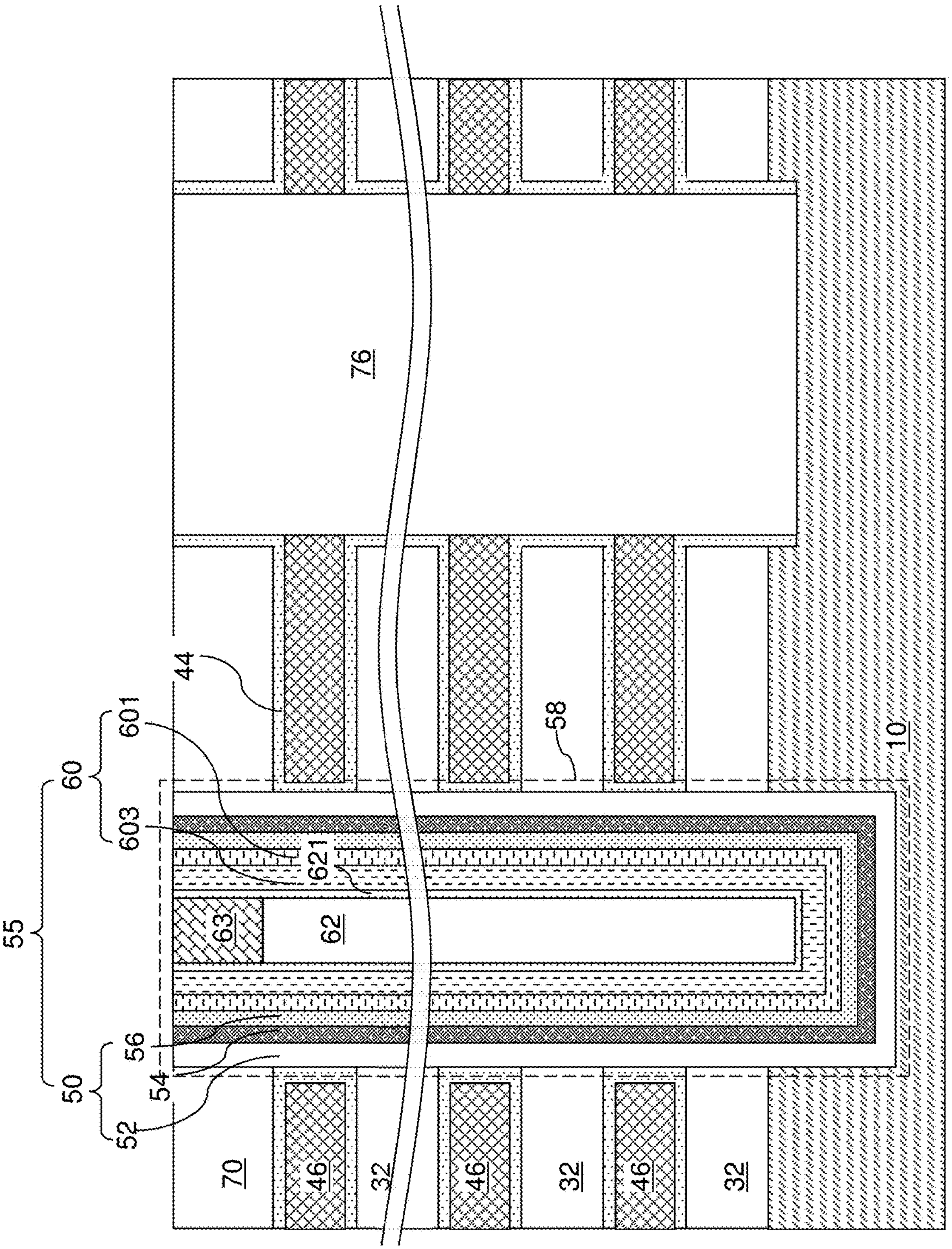
FIG. 12C is a magnified view of a region of the exemplary structure in case second exemplary memory opening fill structures are present in the memory openings according to an embodiment of the present disclosure.

Referring to FIGS. 12A, 12B, and 12C, a dielectric wall structure 76 can be formed within each backside cavity 79' by depositing at least one dielectric material in the remaining unfilled volume (i.e., the backside cavity 79') of the backside trench 79. FIG. 12B illustrates a case in which the memory opening fill structures 58 have a first configuration illustrated in FIG. 5E. FIG. 12C illustrates a case in which the memory opening fill structures 58 have a second configuration illustrated in FIG. 6C. The at least one dielectric material can include silicon oxide, silicon nitride, a dielectric metal oxide, an organosilicate glass, or a combination thereof. In one embodiment, the insulating material layer can include silicon oxide. The at least one dielectric material can be deposited, for example, by low pressure chemical vapor deposition (LPCVD) or atomic layer deposition (ALD). Optionally, the at least one dielectric material can be planarized using the contact level dielectric layer 73 as a stopping layer. If chemical mechanical planarization (CMP) process is used, the contact level dielectric layer 73 can be used as a CMP stopping layer. Each remaining continuous portion of the at least one conductive material in the backside trenches 79 constitutes a dielectric wall structure 76. The dielectric wall structures 76 can be formed between each neighboring pair of alternating stacks (32, 46) of insulating layers 32 and electrically conductive layers.

Figure 13A:
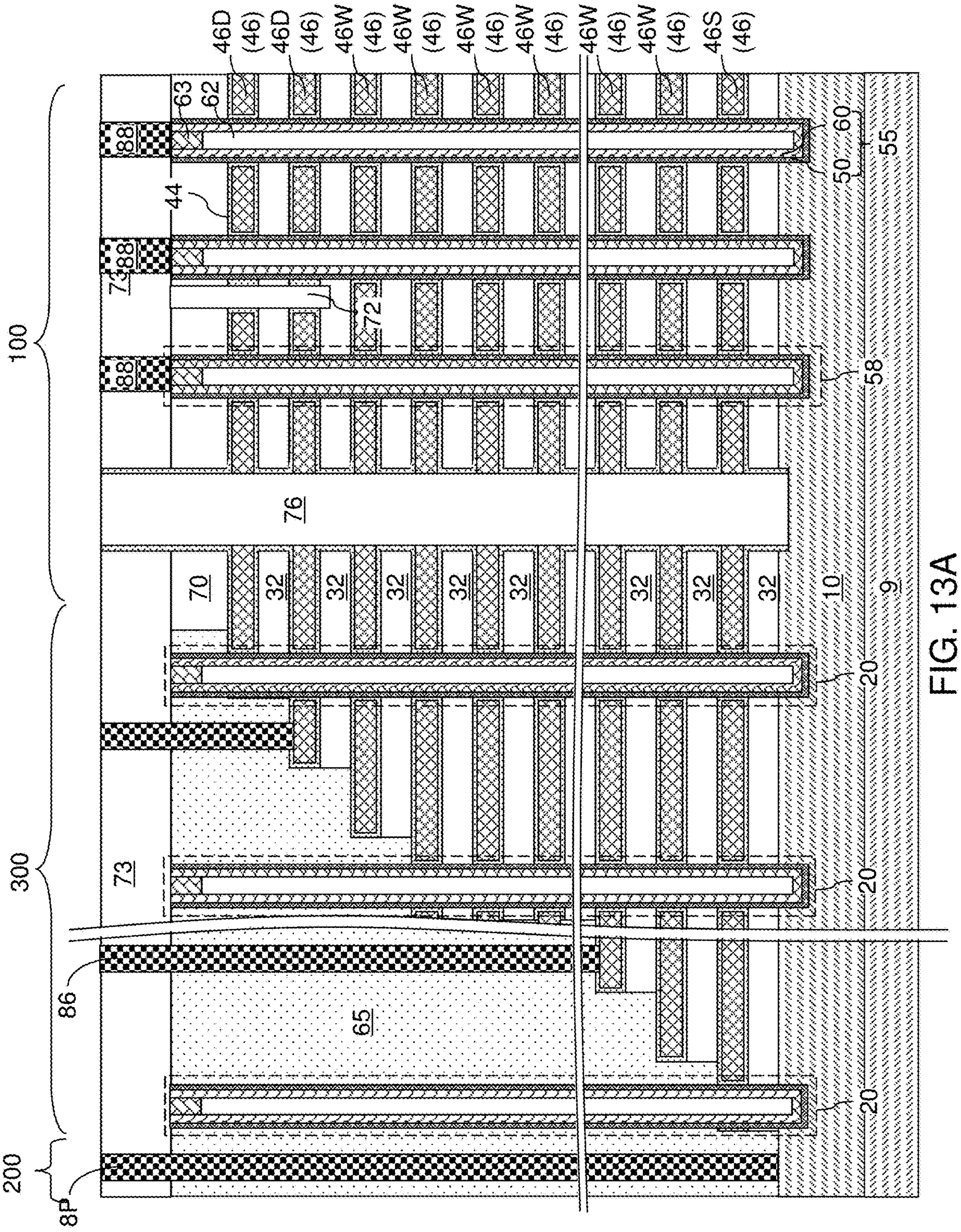
FIG. 13A is a schematic vertical cross-sectional view of the exemplary structure after formation of contact via structures according to an embodiment of the present disclosure.
Figure 13B:
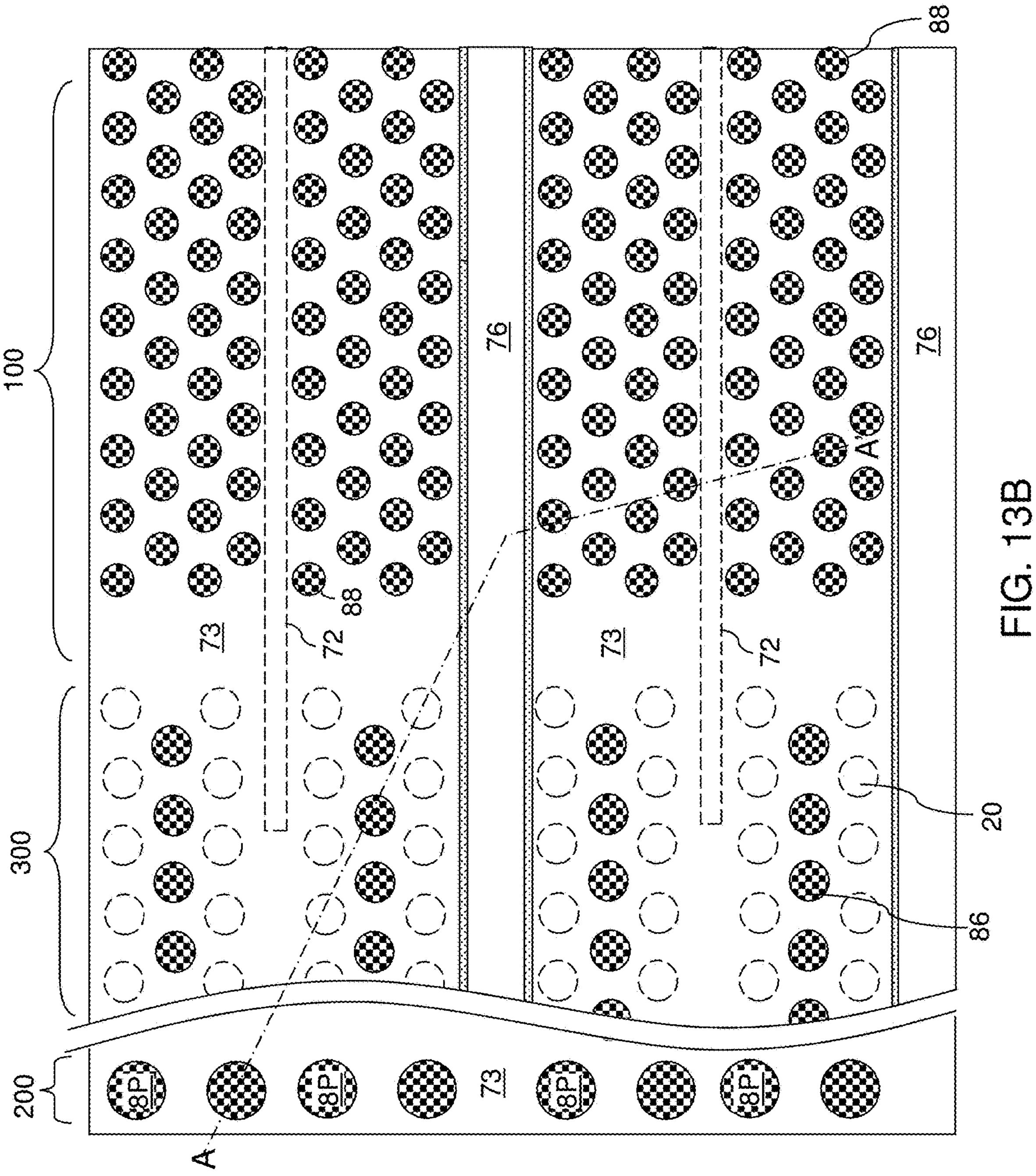
FIG. 13B is a top-down view of the exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact level dielectric layer 73, and optionally through the stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the stepped dielectric material portion 65. Pass-through via structures 8P can be formed through the stepped dielectric material portion 65 to the semiconductor material layer 10.

Figure 14A:
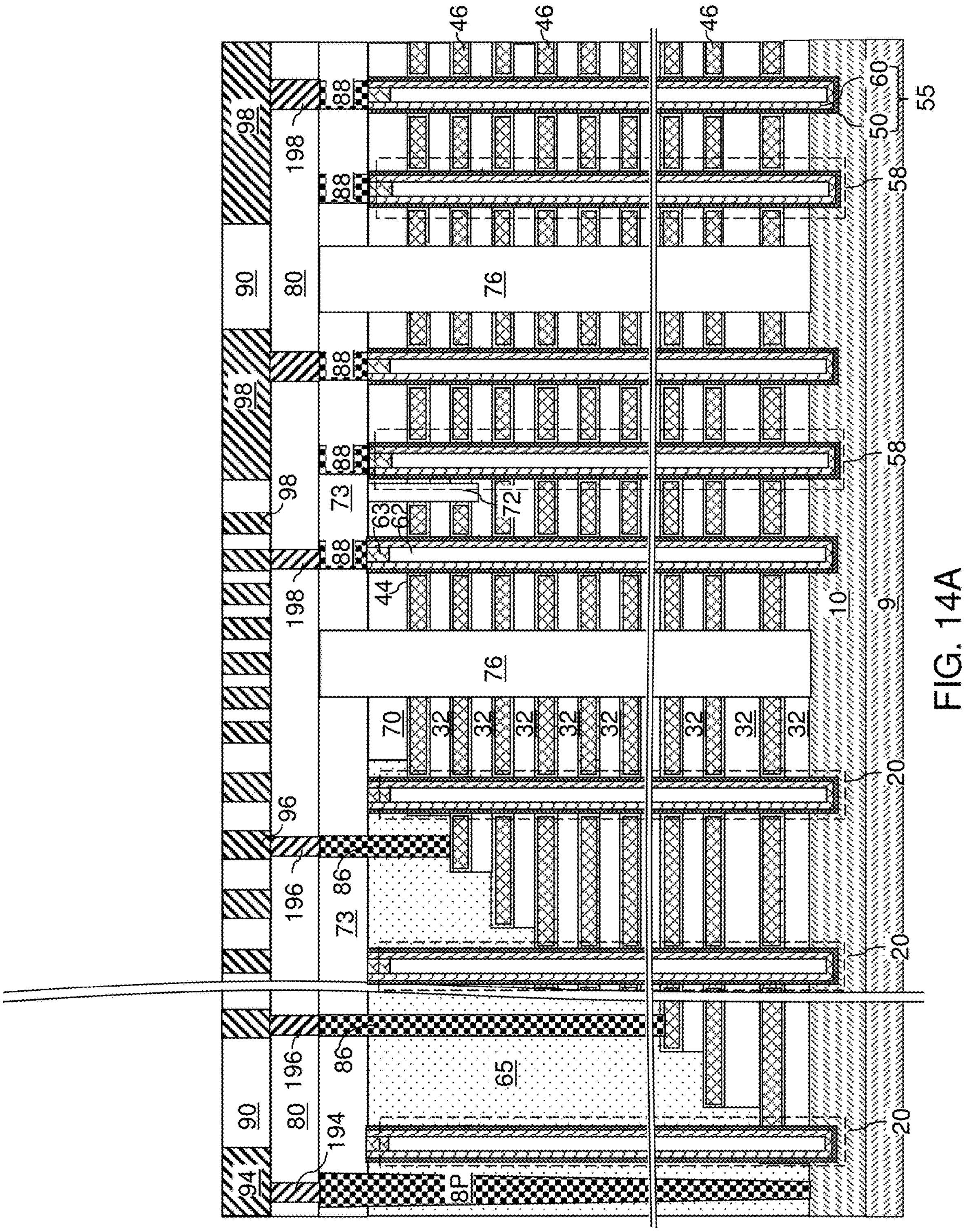
FIG. 14A is a schematic vertical cross-sectional view of the exemplary structure after formation of first via level metal interconnect structures and first line level metal interconnect structures according to an embodiment of the present disclosure.
Figure 14B:
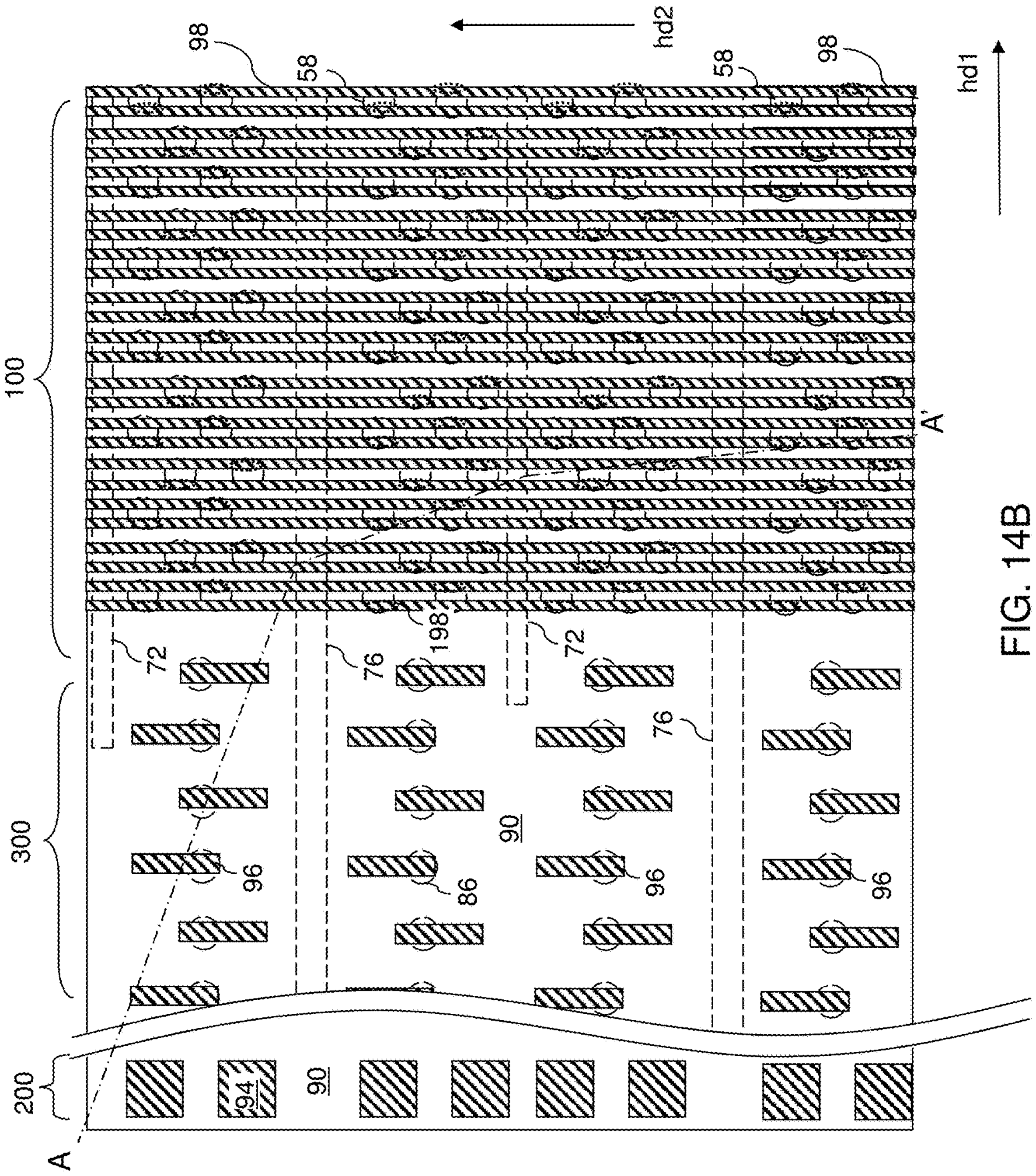
FIG. 14B is a partial see-through top-down view of the exemplary structure of FIG. 14A. The vertical plane A-A' is the plane of the schematic vertical cross-sectional view of FIG. 14A.

Referring to FIGS. 14A and 14B, a via level dielectric layer 80 is formed over the contact level dielectric layer 73. Various contact via structures (198, 196, 194) can be formed through the via level dielectric layer 80. For example, bit line connection via structures 198 can be formed on the drain contact via structures 88, word line connection via structures 196 can be formed on the word line contact via structures 86, and peripheral extension via structures 194 can be formed on the pass-through via structures 8P.

A first line level dielectric layer 90 is deposited over the via level dielectric layer 80. Various metal line structures (98, 96, 94) are formed in the first line level dielectric layer 90. The metal line structures (98, 96, 94) are herein referred to as first line level metal interconnect structures. The various metal line structure (98, 96, 94) include bit lines 98 that are electrically connected to a respective plurality of the drain contact via structures 88 (for example, through the bit line connection via structures 198), a word-line-connection metal interconnect lines 98 that are electrically connected to a respective one of the word line contact via structures 86 (for example, through a bit line connection via structure 198), and peripheral metal interconnect lines 94 that are electrically connected to a respective one of the pass-through via structures 8P (for example, through a peripheral extension via structure 194).

The bit lines 98 are electrically connected to upper ends of a respective subset of the vertical channels 60 in the memory stack structures 55 in the memory array region 100. In one embodiment, the memory stack structures 55 are arranged in rows that extend along the first horizontal direction hd1, and the bit lines 98 laterally extend along the second horizontal direction hd2.

Figure 15:
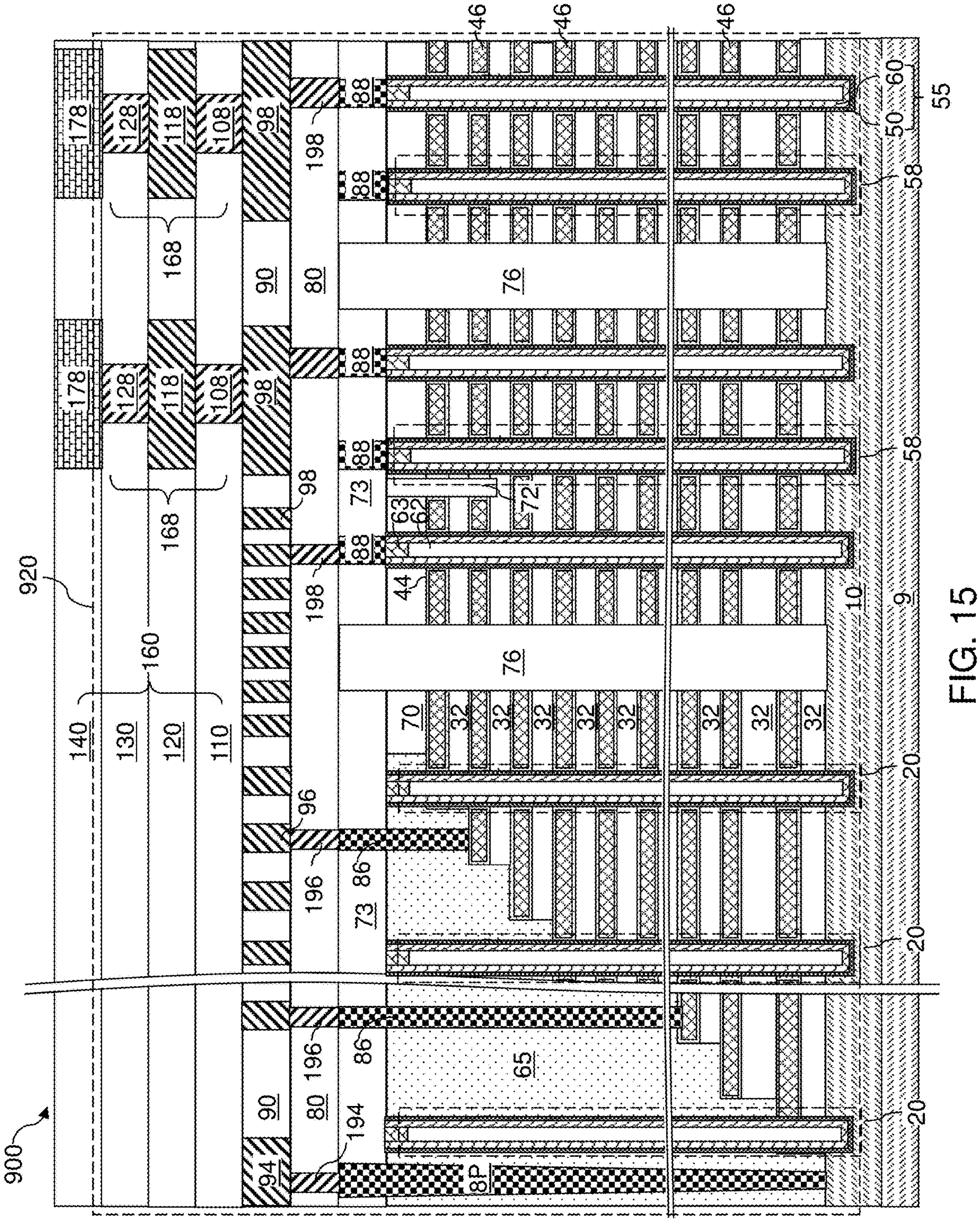
FIG. 15 is a schematic vertical cross-sectional view of the exemplary structure that forms a memory die after formation of additional metal interconnect structures according to an embodiment of the present disclosure.

Referring to FIG. 15, a memory die 900 is formed by optionally performing additional processing steps on the exemplary structure of FIG. 14A. Specifically, additional metal interconnect structures 168 located in additional interconnect level dielectric layers 160 are formed. In an illustrative example, the additional interconnect level dielectric layers 160 can include a via level dielectric layer 110, a second line level dielectric layer 120, a second via level dielectric layer 130, and a metallic pad structure level dielectric layer 140. The metal interconnect structures 168 can include first metal via structures 108 included in the first via level dielectric layer 110, second metal line structures 118 included within the second line level dielectric layer 120, second metal via structures 128 included in the second via level dielectric layer 130, and memory-side bonding pads 178 (such as metallic pad structures) included in the metallic pad structure level dielectric layer 140. While an embodiment is described in which the additional interconnect level dielectric layers 160 include the first via level dielectric layer 110, the second line level dielectric layer 120, the second via level dielectric layer 130, and the metallic pad structure level dielectric layer 140, embodiments are expressly contemplated herein in which the additional interconnect level dielectric layers 160 include a different number and/or different combinations of dielectric material layers. The memory die 900 includes a three-dimensional array of memory elements. Electrical connection paths can be provided between each memory-side bonding pad 178 and a respective set of metal interconnect structures {(194, 94, 108, 118, 128), (196, 96, 108, 118, 128), or (198, 98, 108, 118, 128)}. The memory die 900 includes a memory device 920, which may include a three-dimensional memory array of memory-side metal interconnect structures (86, 88, 194, 94, 196, 96, 198, 98, 168). Generally, memory-side dielectric material layers 160 embedding memory-side metal interconnect structures (86, 88, 194, 94, 196, 96, 198, 98, 168) and memory-side bonding pads 178 can be formed over the alternating stack (32, 46) to provide a memory die 900.

Figure 16:
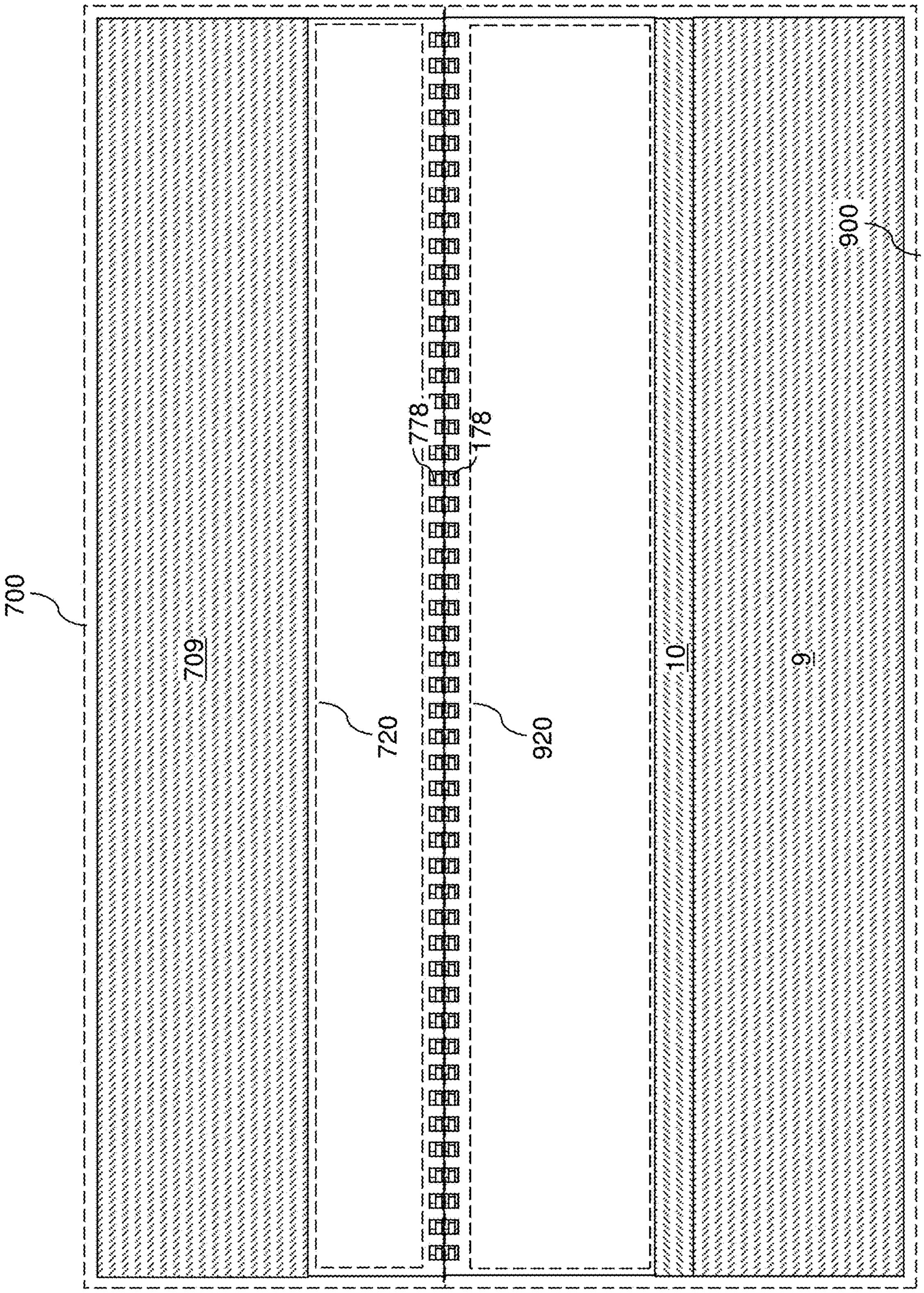
FIG. 16 is a schematic vertical cross-sectional view of the exemplary structure after bonding a logic die to the memory die according to an embodiment of the present disclosure.

Referring to FIG. 16, an optional logic die 700 can be provided, which includes a logic-side substrate 709, a peripheral circuit 720 located on the logic-side substrate 709 and comprising logic-side semiconductor devices (such as field effect transistors) and logic-side metal interconnect structures, and logic-side bonding pads 778. The peripheral circuit 720 can be configured to control operation of the memory device 920 within the memory die 900. Specifically, the peripheral circuit 720 can be configured to drive various electrical components within the memory device 920 including, but not limited to, the electrically conductive layers 46.

The logic die 700 can be attached to the memory die 900, for example, by bonding the logic-side bonding pads 778 to the memory-side bonding pads 178. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process.

Figure 17:
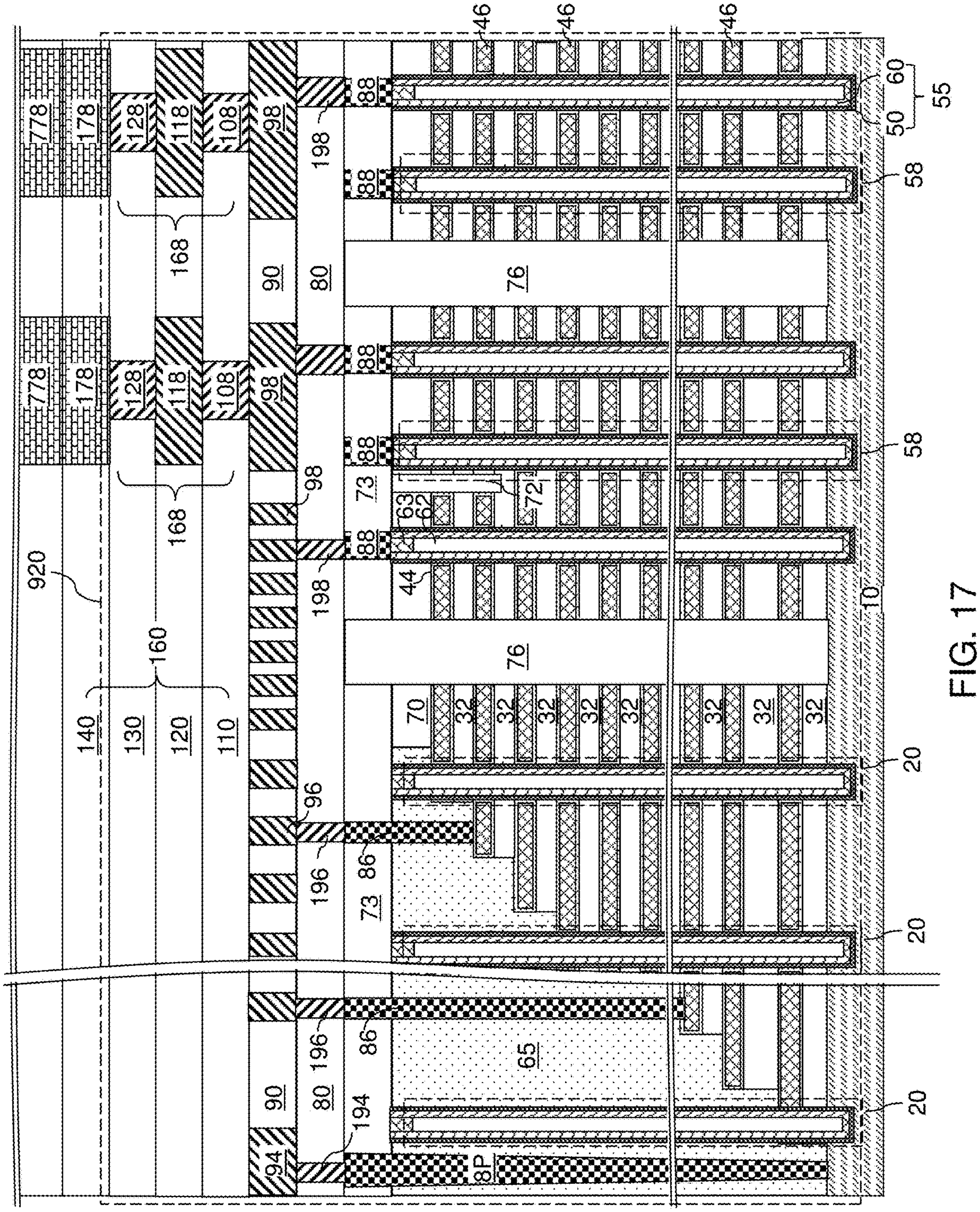
FIG. 17 is a schematic vertical cross-sectional view of a region of the exemplary structure after removal of the substrate layer according to an embodiment of the present disclosure.

Referring to FIG. 17, the carrier substrate 9 can be optionally removed, and bottom surface of the semiconductor material layer 10 can be physically exposed. For example, the carrier substrate 9 can be thinned by grinding, polishing, an isotropic etch process, and/or an anisotropic etch process.

Figure 18:
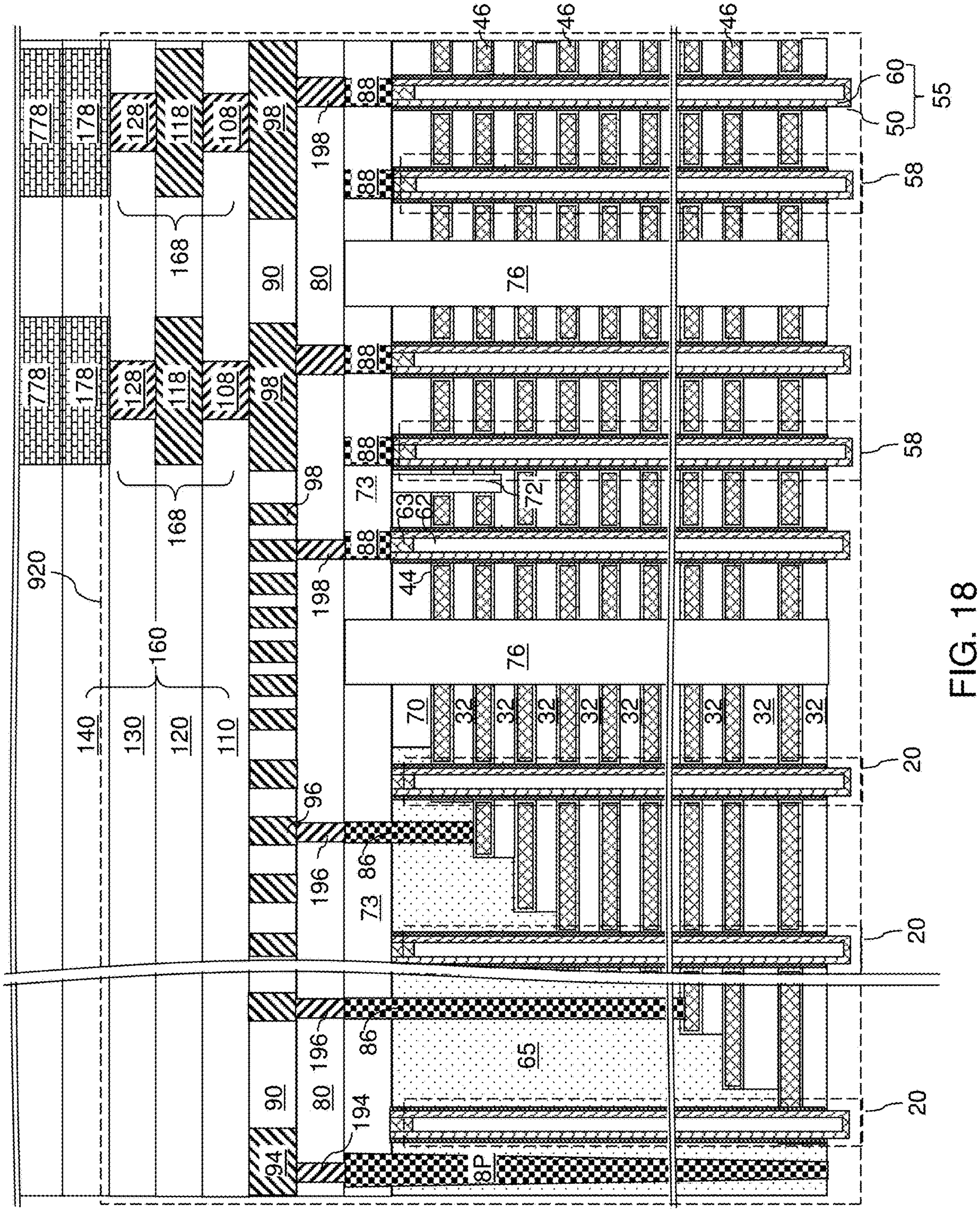
FIG. 18 is a schematic vertical cross-sectional view of a region of the exemplary structure after physically exposing end portions of vertical channels according to an embodiment of the present disclosure.

Referring to FIG. 18, the semiconductor material layer 10 can be subsequently removed selective to the memory films 50. In one embodiment, the semiconductor material layer 10 may be removed by a selective etch process that removes the semiconductor material of the semiconductor material layer 10 selective to the dielectric materials of the memory films 50, the insulating layers 32, and the dielectric wall structures 76. For example, a wet etch process employing potassium hydroxide or another suitable etchant may be performed to remove the semiconductor material layer 10.

Subsequently, a sequence of isotropic etch processes may be performed to sequentially etch the materials of the memory films 50. For example, a sequence of wet etch processes may be performed to etch physically exposed bottom portions of the blocking dielectric layers 52, the charge storage layers 54, and the tunneling dielectric layers 56. End portions of vertical channels 60 can be physically exposed. Generally, an end portion of each indium tin zinc oxide layer 601 can be physically exposed by removing a substrate (9, 10) and an end portion of each memory film 50.

Figure 19:
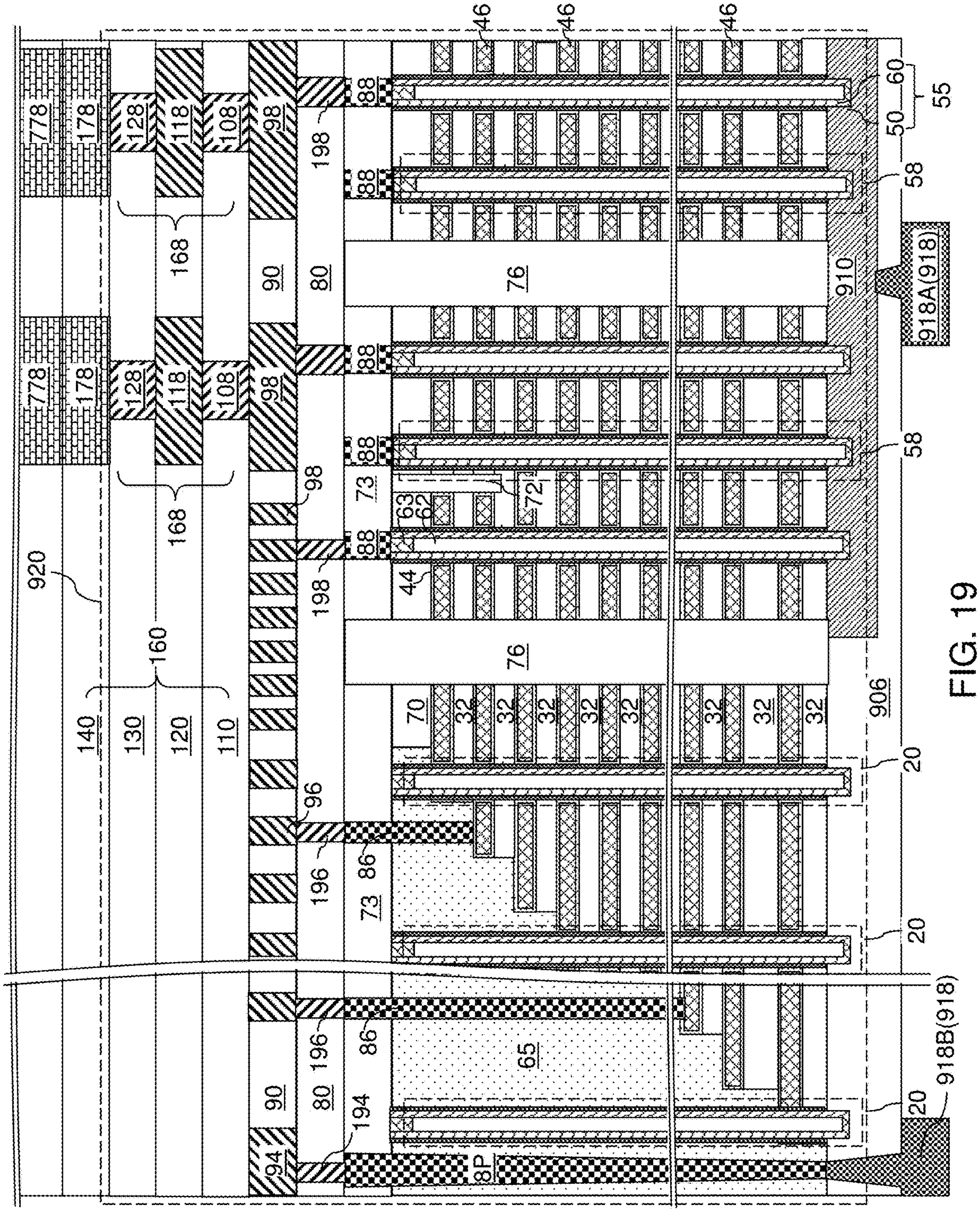
FIG. 19 is a schematic vertical cross-sectional view of a region of the exemplary structure after formation of a source layer and backside bonding structures according to an embodiment of the present disclosure.

Referring to FIG. 19, a semiconductor material layer (e.g., source layer) 910 can be deposited on the physically exposed surfaces of the vertical channels 60 in the memory opening fill structures 58. The semiconductor material layer 910 may comprise a silicon layer or a compound semiconductor layer, such as a metal oxide semiconductor (e.g., IGZO and/or ITZO) layer. The semiconductor material layer 910 may be patterned such that the semiconductor material layer 910 does not contact the vertical channels 60 within the support pillar structures 20. In one embodiment, the semiconductor material layer 910 may have a same type of doping as the drain regions 63, and may function as a source layer, which is a common source region, for the vertical field effect transistors including the vertical channels 60. Generally, a source region (comprising the semiconductor material layer 910) can be formed on an end portion of each of the indium tin zinc oxide layer 601. The semiconductor material layer 910 can be in contact with a horizontal surface of the alternating stack (32, 46), such as a horizontal bottom surface of a bottommost insulating layer 32 within the alternating stack (32, 46).

A backside insulating layer 906 can be formed on the semiconductor material layer 910 and on any physically exposed surface of the alternating stack (32, 46). Backside bonding structures 918 can be formed through backside insulating layer 906. The backside bonding structures 918 may include, for example, at least one source-connection backside bonding structure 918A and at least one additional backside bonding structure 918B that is electrically connected to a respective one of the memory-side metal interconnect structures (86, 88, 194, 94, 196, 96, 198, 98, 168) using the pass through via structure 8P.

Figure 20A:
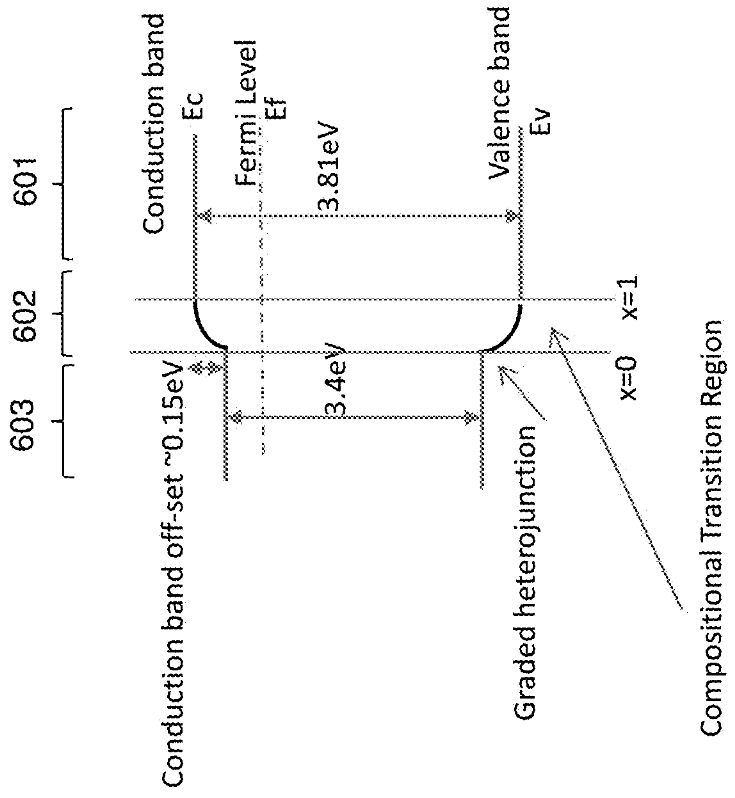
FIG. 20A is a band diagram of a vertical channel in the first exemplary memory opening fill structure according to an embodiment of the present disclosure.

Referring to FIG. 20A, a band diagram of a vertical channel 60 in the first exemplary memory opening fill structure 58 shown in FIG. 5E according to an embodiment of the present disclosure is illustrated. An indium gallium tin zinc oxide layer 602 provides a graded compositional transition region between the indium tin zinc oxide layer 601 and the indium gallium zinc oxide layer 603.

Figure 20B:
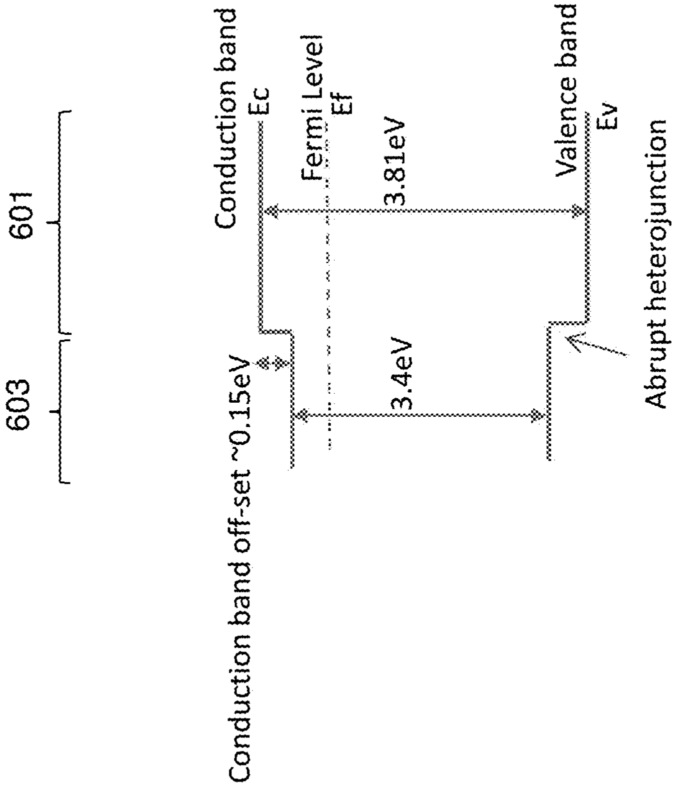
FIG. 20B is a band diagram of a vertical channel in the second exemplary memory opening fill structure according to an embodiment of the present disclosure.

Referring to FIG. 20B, a band diagram of a vertical channel in the second exemplary memory opening fill structure 58 shown in FIG. 6C according to an embodiment of the present disclosure is illustrated. An abrupt heterojunction is present between the indium tin zinc oxide layer 601 and the indium gallium zinc oxide layer 603.

The various embodiments of the present disclosure provide a composite metal oxide semiconductor channel for a three-dimensional memory device, such as a three-dimensional NAND memory device. A layer stack including a indium tin zinc oxide layer 601 and an indium gallium zinc oxide layer 603 provides superior performance and reliability over prior art single layer (i.e., uniform composition) metal oxide semiconductor channels. Specifically, the composite metal oxide semiconductor channel 60 simultaneously provides higher charge carrier mobility, lower leakage current, a smaller subthreshold slope, and thus, superior performance and reliability and reduced device variability compared to devices employing a single metal oxide layer semiconductor channel.

Although the foregoing refers to particular preferred embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A semiconductor structure comprising a memory die, the memory die comprising:

an alternating stack of insulating layers and electrically conductive layers;

a memory opening vertically extending through the alternating stack; and a memory opening fill structure located in the memory opening and comprising a memory film and a vertical composite metal oxide semiconductor channel comprising a different composition between its inner and outer portions;

wherein the vertical composite metal oxide semiconductor channel comprises an indium tin zinc oxide layer in the outer portion, and an indium gallium zinc oxide layer in the inner portion; and wherein the vertical composite metal oxide semiconductor channel further comprises an indium gallium tin zinc oxide layer located between the indium tin zinc oxide layer and the indium gallium zinc oxide layer.

2. The semiconductor structure of claim 1, wherein the indium tin zinc oxide layer is in direct contact with the memory film, and the indium gallium zinc oxide layer is laterally spaced from the memory film by the indium tin zinc oxide layer.

3. The semiconductor structure of claim 1, wherein the memory film has a cylindrical inner sidewall that vertically extends through each of the electrically conductive layers within the alternating stack.

4. The semiconductor structure of claim 3, wherein the indium tin zinc oxide layer comprises a cylindrical outer sidewall that contacts the cylindrical inner sidewall of the memory film.

5. The semiconductor structure of claim 1, wherein the indium gallium tin zinc oxide layer has a radial compositional gradient such that:

an atomic concentration of tin decreases with a lateral distance from the indium tin zinc oxide layer within the indium gallium tin zinc oxide layer; and an atomic concentration of gallium decreases with a lateral distance from the indium gallium zinc oxide layer within the indium gallium tin zinc oxide layer.

6. The semiconductor structure of claim 1, wherein an atomic concentration of free charge carriers within the indium tin zinc oxide layer is at least three times an atomic concentration of free charge carriers within the indium gallium zinc oxide layer.

7. The semiconductor structure of claim 1, further comprising a drain region contacting an upper end of the vertical composite metal oxide semiconductor channel.

8. The semiconductor structure of claim 7, further comprising a source region having a doping of a same conductivity type as the drain region and contacting a lower end of the vertical composite metal oxide semiconductor channel.

9. The semiconductor structure of claim 1, wherein the memory film comprises:

a tunneling dielectric layer in contact with the indium tin zinc oxide layer;

a vertical stack of charge storage elements located at levels of the electrically conductive layers and contacting the tunneling dielectric layer; and a blocking dielectric layer interposed between the vertical stack of charge storage elements and the electrically conductive layers.

10. The semiconductor structure of claim 1, wherein:

the memory die comprises memory-side dielectric material layers embedding memory-side metal interconnect structures and memory-side bonding pads; and the semiconductor structure further comprises a logic die including a peripheral circuit and logic-side bonding pads that are bonded to the memory-side bonding pads.

* * * * *